(12) United States Patent
Kok et al.

(10) Patent No.: US 10,483,930 B2
(45) Date of Patent: Nov. 19, 2019

(54) PERSONALIZED ADJUSTMENT OF AN AUDIO DEVICE

(71) Applicant: BITwave Pte Ltd, Singapore (SG)

(72) Inventors: Hui Siew Kok, Singapore (SG); Tan Eng Sui, Singapore (SG)

(73) Assignee: BITWAVE PTE LTD., Singapore (SG)

( * ) Notice: Subject to any disclaimer, the term of this patent is extended or adjusted under 35 U.S.C. 154(b) by 0 days.

(21) Appl. No.: 15/834,264

(22) Filed: Dec. 7, 2017

(65) Prior Publication Data

US 2018/0097495 A1     Apr. 5, 2018

Related U.S. Application Data

(63) Continuation of application No. 14/867,107, filed on Sep. 28, 2015, now Pat. No. 9,871,496, which is a continuation of application No. 13/191,033, filed on Jul. 26, 2011, now Pat. No. 9,172,345.

(60) Provisional application No. 61/368,173, filed on Jul. 27, 2010, provisional application No. 61/368,170, filed on Jul. 27, 2010.

(51) Int. Cl.
| | |
|---|---|
| H04R 29/00 | (2006.01) |
| H03G 3/32 | (2006.01) |
| H04R 25/00 | (2006.01) |
| H03G 5/02 | (2006.01) |
| H04R 1/22 | (2006.01) |
| H04R 3/04 | (2006.01) |

(52) U.S. Cl.
CPC ............... *H03G 3/32* (2013.01); *H03G 5/025* (2013.01); *H04R 1/22* (2013.01); *H04R 3/04* (2013.01); *H04R 25/30* (2013.01); *H04R 25/305* (2013.01); *H04R 25/70* (2013.01); *H04R 29/00* (2013.01); *H04R 2430/01* (2013.01)

(58) Field of Classification Search
CPC . H03G 3/32; H03G 3/025; H03G 3/24; H04R 1/22; H04R 3/04; H04R 25/30; H04R 25/305; H04R 25/70; H04R 29/00
USPC ............................................. 381/57, 60, 56
See application file for complete search history.

(56) References Cited

U.S. PATENT DOCUMENTS

| | | | |
|---|---|---|---|
| 6,385,322 B1 * | 5/2002 | Mietling | H04R 3/04 |
| | | | 381/59 |
| 6,944,474 B2 | 9/2005 | Rader et al. | |

(Continued)

OTHER PUBLICATIONS

Office Action dated Sep. 12, 2013 for U.S. Appl. No. 13/191,033, 23 pages.

(Continued)

*Primary Examiner* — Disler Paul
(74) *Attorney, Agent, or Firm* — Amin, Turocy & Watson, LLP

(57) ABSTRACT

User adjustment of an audio effect of an audio device is facilitated to match a hearing sensitivity of a user. The user can tune the audio device with a minimum perceptible level unique to the user. The audio device can adjust the audio effect in accordance with the minimum perceptible level. For example, a loudness level can adjust automatically to ensure that the user maintains a perceptible loudness, adjusting according to environmental noise and according to the minimum perceptible level. Also described herein are apparatuses, systems and methods related to an audio device equipped with embedded audio sensors that can maximize a voice quality while minimizing the effects of noise.

20 Claims, 19 Drawing Sheets

(56) References Cited

U.S. PATENT DOCUMENTS

| | | | |
|---|---|---|---|
| 7,613,314 B2 | 11/2009 | Camp et al. | |
| 8,379,871 B2 | 2/2013 | Michael et al. | |
| 8,380,497 B2 | 2/2013 | Mohammad et al. | |
| 8,798,289 B1 | 8/2014 | Every et al. | |
| 2002/0146137 A1* | 10/2002 | Kuhnel | H04R 25/356 381/60 |
| 2003/0064746 A1* | 4/2003 | Rader | H04R 25/70 455/550.1 |
| 2005/0094822 A1* | 5/2005 | Swartz | A61B 5/121 381/56 |
| 2005/0185798 A1* | 8/2005 | Carney | H04R 25/356 381/60 |
| 2008/0130958 A1 | 6/2008 | Ziomek | |
| 2009/0034752 A1 | 2/2009 | Zhang et al. | |
| 2009/0074214 A1* | 3/2009 | Bradford | H04R 25/558 381/312 |
| 2010/0020988 A1 | 1/2010 | McLeod | |
| 2011/0305346 A1 | 12/2011 | Daugbigny | |
| 2012/0183166 A1* | 7/2012 | Schneider | H04R 25/658 381/314 |
| 2013/0121496 A1* | 5/2013 | Boretzki | H04R 25/70 381/60 |

OTHER PUBLICATIONS

Final Office Action dated Jan. 7, 2014 for U.S. Appl. No. 13/191,033, 21 pages.
Office Action dated May 29, 2014 for U.S. Appl. No. 13/191,033, 12 pages.
Office Action dated Nov. 19, 2014 for U.S. Appl. No. 13/191,033, 14 pages.
Final Office Action dated Mar. 6, 2015 for U.S. Appl. No. 13/191,033, 19 pages.
Notice of Allowance dated Jun. 16, 2015 for U.S. Appl. No. 13/191,033, 7 pages.
Office Action dated Jun. 10, 2016 for U.S. Appl. No. 14/867,107, 24 pages.
Final Office Action dated Oct. 12, 2016 for U.S. Appl. No. 14/867,107, 20 pages.
Office Action dated Feb. 22, 2017 for U.S. Appl. No. 14/867,107, 17 pages.
Final Office Action dated Jul. 10, 2017 for U.S. Appl. No. 14/867,107, 17 pages.

* cited by examiner

PERSONALIZED ADJUSTMENT OF AN AUDIO DEVICE

RELATED APPLICATION

This application is a continuation of, and claims priority to, U.S. patent application Ser. No. 14/867,107, filed on Sep. 28, 2015, entitled "PERSONALIZED ADJUSTMENT OF AN AUDIO DEVICE", which is a continuation of U.S. patent application Ser. No. 13/191,033 (now U.S. Pat. No. 9,172,345), filed on Jul. 26, 2011, entitled "PERSONALIZED ADJUSTMENT OF AN AUDIO DEVICE", which claim priority to U.S. Provisional Patent Application No. 61/368,170, filed Jul. 27, 2010, entitled "System and Apparatus for Personalization of Listening Device", and U.S. Provisional Patent Application No. 61/368,173, filed Jul. 27, 2010, entitled "System and Apparatus for Robust Beamforming". The entireties of the foregoing applications listed are hereby incorporated by reference herein.

TECHNICAL FIELD

This disclosure relates generally to audio effects, and in particular to the adjustment of audio effects to personalize an audio device for a given individual based on an audio sensitivity of the ears of the individual.

BACKGROUND

Different individuals exhibit different hearing sensitivities. This is due to the fact that the frequency response of individual ears, corresponding to the hearing sensitivity, is different for each individual. Accordingly, an audio device that may produce good results for one individual can produce poor results for another individual. For example, an expensive hi-fi stereo headphone can appear to produce good audio quality for one individual, while the same audio effect may not be perceived well by another individual. Even for the same individual, the left and the right ears can exhibit different frequency responses. Therefore, the same audio device may produce very different results for each ear of the same individual.

Conventional audio devices can utilize a narrow frequency range, frequency equalization or volume control to overcome these problems. For example, some communications devices can use a narrow audio bandwidth, for example between 300 Hertz and 3800 Hertz. However, if the hearing sensitivity of a user is poor within the audio bandwidth, the user may not be able to hear and/or communicate properly. Other audio devices, such as a portable MP3 player, a CD player or a mobile phone, can incorporate an audio equalizer to enhance sound quality by equalizing the frequency response of the speaker. However, the equalizer it is not able to equalize the hearing sensitivity of each individual user, limiting the effectiveness of the audio equalizer. Each individual user will still perceive the audio effect differently. Other audio devices, such as headsets, headphones, or mobile devices, utilize volume control in which a user can adjust the volume if the output sound level is not optimal for the user. Changing the volume can change the overall signal level accordingly. For example, increasing the volume can increase the overall signal level. However, the user may find that the sound that can already be heard becomes louder, but the sound that cannot be perceived remains unperceivable. Increasing the sound level further can lead to signal saturation, clipping or distortion due to the limited dynamic range of all such audio devices.

The above-described deficiencies of conventional acoustic sensing devices are merely intended to provide an overview of some of problems of current technology, and are not intended to be exhaustive. Other problems with the state of the art and corresponding benefits of some of the various non-limiting embodiments described herein may become further apparent upon review of the following detailed description.

SUMMARY

The following presents a simplified summary to provide a basic understanding of some aspects described herein. This summary is not an extensive overview of the disclosed subject matter. It is not intended to identify key or critical elements of the disclosed subject matter, or delineate the scope of the subject disclosure. Its sole purpose is to present some concepts of the disclosed subject matter in a simplified form as a prelude to the more detailed description presented later.

To correct for the above noted deficiencies and other drawbacks of current audio devices, an audio device that can provide adjustment of audio effects to personalize the audio device for a given individual based on an audio sensitivity of the ears of the individual is provided. A user can set a minimum perceptible level of hearing sensitivity at different audio frequency bands with respect to the audio device (e.g., a headset) used. Based on the minimum perceptible level, a set of parameters, including a gain setting, can be derived. The set of parameters can then be applied to multi-band filters to offset or equalize the hearing sensitivity. The set of parameters can be unique to each user, so the audio can be personalized to the user.

After the system is tuned, and when the system is in normal use, it can monitor environmental noise and automatically adjust the hearing level of the user according to the environmental noise and the hearing sensitivity. This means the signal level in each frequency band can automatically adjust to match the hearing level of the user.

The system can include an audio device, such as a headset, with a multi-band filter audio output. The system can also include a man machine interface (e.g., a control panel) that can facilitate selection of a frequency band and a control of volume. The man machine interface can interface with the audio device either wired or wirelessly. When the man machine interface and the audio device are interfaced, the audio device can enter a tuning mode in which the man machine interface can send commands to the audio device to produce a tone in a selected audio band. The user can personally adjust a volume of the tone on the man machine interface until the user can clearly perceive the tone. The level at the frequency and for the speaker can be stored as a minimum perceived level for the user. The user can repeat the same process for all of the available frequency bands to match the audio device to the hearing sensitivity of the user. When the tuning process is complete, a gain setting for each audio band can be computed and stored by the audio device. The gain setting can be applied to the multi-band filter during normal operation of the audio device. Once the system is tuned, the user can use the system in different levels of noise situations and the system can automatically adjust the loudness to match the environmental noise and the hearing level of the user.

Also described herein is an exemplary audio device and methods for utilizing the audio device. The audio device can use a micro-array of two or three audio sensors, depending on the number of beams that are needed. The audio sensors can be closely spaced, and even placed on top of each other, depending on size constraints, and utilized for both near-field and far-field applications. The audio device can employ a signal processing algorithm that optimizes voice quality while minimizing noise.

The following description and the annexed drawings set forth in detail certain illustrative aspects of the disclosed subject matter. These aspects are indicative, however, of but a few of the various ways in which the principles of the innovation may be employed. The disclosed subject matter is intended to include all such aspects and their equivalents. Other advantages and distinctive features of the disclosed subject matter will become apparent from the following detailed description of the innovation when considered in conjunction with the drawings.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

Figure 1:
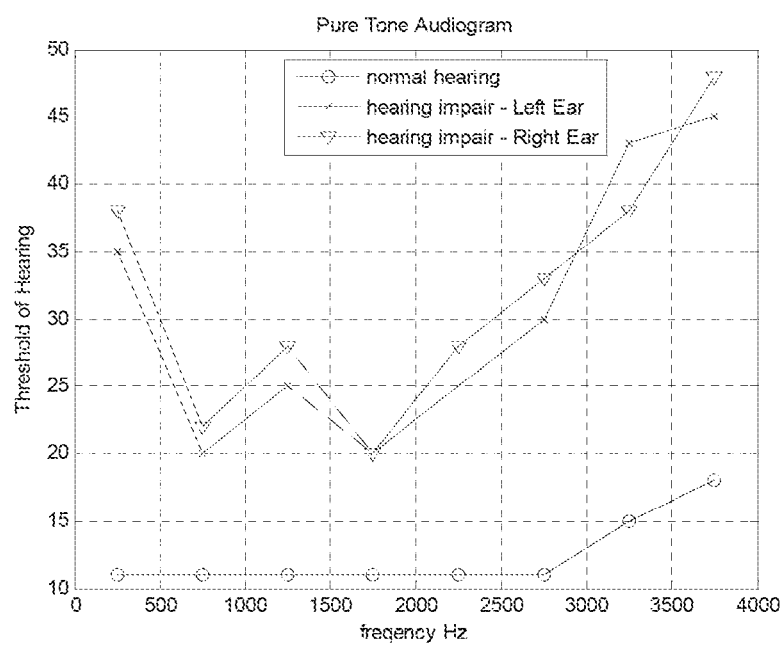
FIG. 1 illustrates a plot of the frequency response for both normal and hearing impaired ears.

In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Described herein are various embodiments applicable in the field of audio devices. Examples of audio devices can include speech communication devices, entertainment devices, and hearing aids. The various embodiments described herein can allow a user to adjust the audio effect of the audio device to match the hearing sensitivity of the user's ears. For example, the audio device can be an audio headset system that can match the hearing sensitivity of the user's ears to that a loudness level (e.g., a volume) of a loudspeaker embedded in the headset, thus improving the hearing and listening experience of the user. The loudness level can be adjusted automatically based on the perception of loudness by the user in tandem with the level of environmental noise.

Reference throughout this specification to "various embodiments," "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

One or more embodiments described herein can include one or more "components." As utilized herein, terms "component," "system," "interface," "unit," and the like are intended to refer to a computer-related entity, hardware, software (e.g., in execution), and/or firmware. For example, a component can be a processor, a process running on a processor, an object, an executable, a program, a storage device, and/or a computer. By way of illustration, an application running on a server and the server can be a component. One or more components can reside within a process, and a component can be localized on one computer and/or distributed between two or more computers.

Further, these components can execute from various computer readable media having various data structures stored thereon. The components can communicate via local and/or remote processes such as in accordance with a signal having one or more data packets (e.g., data from one component interacting with another component in a local system, distributed system, and/or across a network, e.g., the Internet, a local area network, a wide area network, etc. with other systems via the signal).

As another example, a component can be an apparatus with specific functionality provided by mechanical parts operated by electric or electronic circuitry; the electric or electronic circuitry can be operated by a software application or a firmware application executed by one or more processors; the one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components. In an aspect, a component can emulate an electronic component via a virtual machine, e.g., within a cloud computing system.

The words "exemplary" and "example" is used herein to mean serving as an example, instance, or illustration. For the avoidance of doubt, the subject matter described herein is not limited by such examples. In addition, any aspect or design described herein as "exemplary" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

In addition, the disclosed subject matter can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, computer-readable carrier, or computer-readable media. For example, computer-readable media can include, but are not limited to, a magnetic storage device, e.g., hard disk; floppy disk; magnetic strip(s); an optical disk (e.g., compact disk (CD), a digital video disc (DVD), a Blu-ray Disc™ (BD)); a smart card; a flash memory device (e.g., card, stick, key drive); and/or a virtual device that emulates a storage device and/or any of the above computer-readable media.

Various embodiments described herein can allow a user to adjust the audio effect of an audio device to match the hearing sensitivity of the user's ears. Different users can exhibit different hearing sensitivities due to the different frequency response characteristics of different ears. This difference in frequency response is exemplified by FIG. 1, which is a plot illustrating the frequency response in an ear with marginal hearing impairment together with the frequency response of an ear with normal hearing.

As illustrated in FIG. 1, the frequency response of an ear with normal hearing has a low, constant threshold of hearing for sounds of low frequency. For sounds above a frequency of about 2700 Hz, the threshold exhibits a linear slope as the frequencies increase. In contrast, hearing impaired ears exhibit a higher threshold of hearing for sounds all frequencies.

Figure 2:
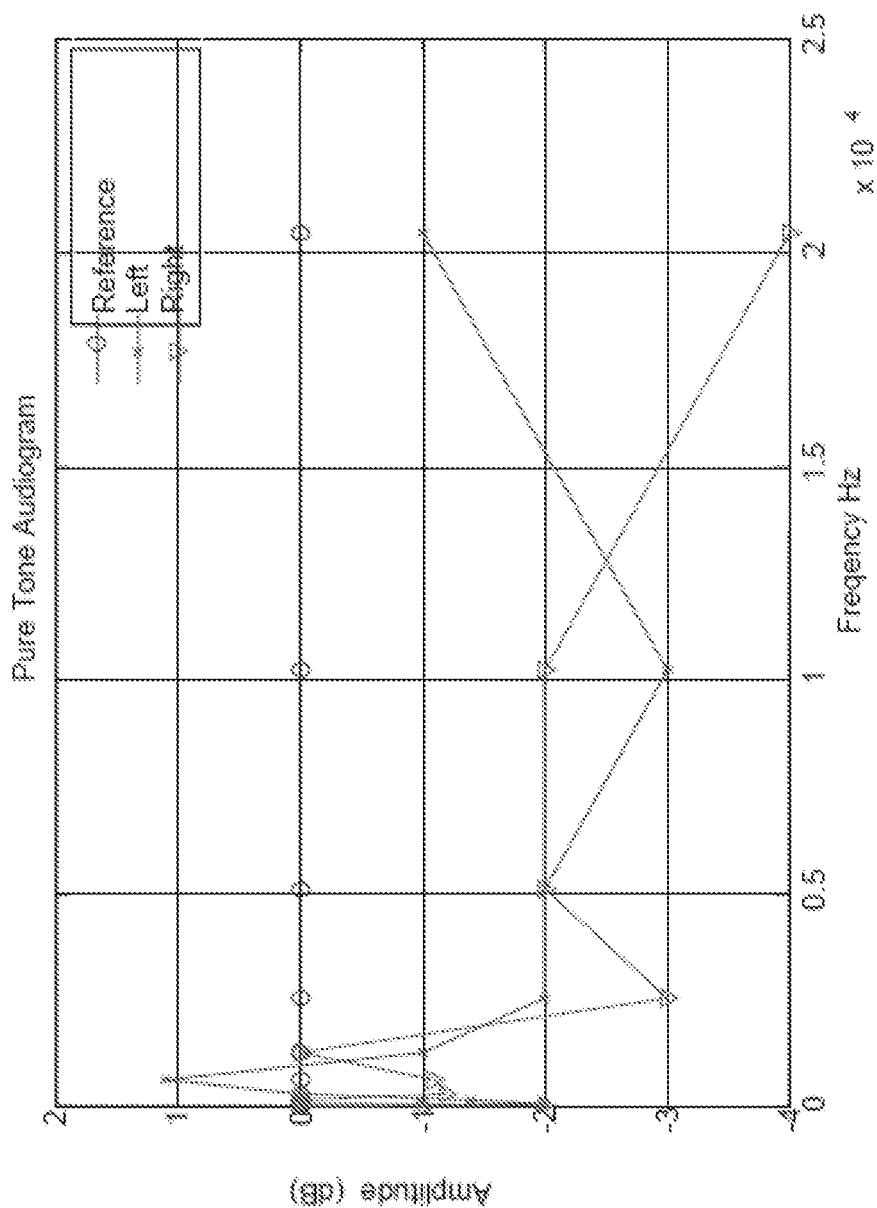
FIG. 2 illustrates a plot of the frequency response of exemplary loudspeakers embedded within a pair of headphones.

Audio devices, such as headphones employing loudspeakers, cannot provide good sound quality for the hearing impaired. Headphones employing loudspeakers can include headphones employed together with mobile devices, like a BLUETOOTH™ headset and hands free car system. FIG. 2 illustrates a plot of the frequency response of exemplary loudspeakers embedded within a pair of headphones. The frequency response of two headphone loudspeakers can try to emulate the frequency response of the normal ear as shown in FIG. 2. However, the frequency response of a loudspeaker can vary greatly when embedded into the housing of a headphone. Accordingly, the frequency response of the loudspeaker in the headphone casing does not match the frequency response of the normal ear of the hearing impaired ear.

The various embodiments described herein can correct the frequency response of the loudspeaker in the headphone casing, and other audio devices, to correspond to both normal ears and hearing impaired ears. A technique described herein allows a user to discover the minimum perceptible level of hearing sensitivity at different audio frequency bands with respect to the audio device used in a normal and/or quiet environment. Based on the minimum perceptible level, a set of parameters ("gain setting") can be derived that is unique to each individual. The set of parameters can then be applied to multi-band filters to offset or equalize the hearing sensitivity and personalize the audio device for each user. After the audio device is tuned for the individual user, and when the audio device is in use, the audio device can monitor the noise spectral and its level in the environment. The audio device can automatically adjust the hearing level for each frequency band so as to ensure that it is always above the original perceptible hearing level of the user so that the signal level in each of the frequency bands can be automatically adjusted to match the hearing level of the individual user.

Figure 3:
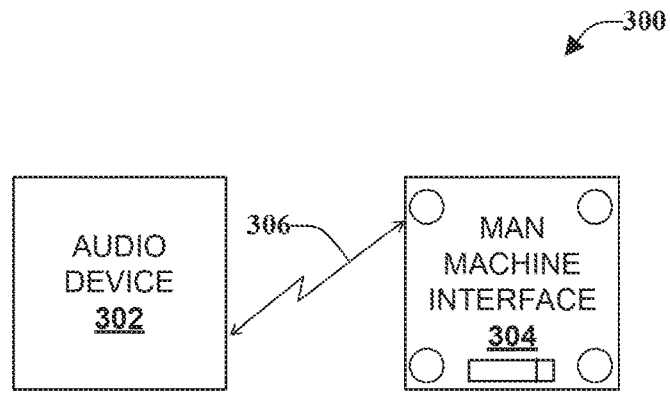
FIG. 3 illustrates an example system that can allow a user to discover a minimum perceptible level of hearing sensitivity specific to the user at different audio frequency bands with respect to an audio device.

Referring now to FIG. 3, illustrated is an example system 300 that can allow a user to discover a minimum perceptible level of hearing sensitivity specific to the user at different audio frequency bands with respect to an audio device 302. For simplicity of explanation, audio device 302 is illustrated as a headset, but it will be understood that audio device 302 can include any type of audio device where a digital signal processor or a micro computing unit can be embedded to carry out the functionality described herein, such as multi-band signal processing and multi-band signal filtering. Examples of an audio device 302 can include speech communication devices, entertainment devices, and hearing aids, such as BLUETOOTH™ headsets, stereo headphones, hearing aid devices, etc.

System 300 can include a man machine interface (MMI) 304. As illustrated, the MMI can include a control panel including a slider bar and a four button select switch. However, the control panel can include any number of sliders, buttons, switches or any other input mechanisms in any configuration that facilitates user input. The MMI 304 can be a separate module or device from the audio device 302. The MMI 304 is not necessary for normal use of the audio device, and is only necessary during a tuning mode, for example, to train the audio device 302 for a new user with unique hearing capabilities.

The MMI 304 can interface with audio device 302. The interface 306 between the MMI 304 and the audio device 302 can be a wired interface, a wireless interface, or a combination thereof. The interface 306 links the MMI 304 to the audio device. This can allow a user to utilize the MMI 304 to adjust the audio of the audio device 302 to match a hearing level of the user with respect to the loudspeaker utilized in the audio device 302

When the audio device 302 is linked to the MMI 304 through the interface 306, audio device 302 can enter a tuning mode. During the tuning mode, the MMI can allow a user to adjust a level setting of the audio device 302. The MMI 304 includes a gain control mechanism and a selector switch to select the desired frequency band. For example, the gain control mechanism can include a slide bar and the selector switch can include the four button switch.

In the tuning mode, the audio device 302 can produce a tone based on the frequency band defined by the selector switch of the MMI 304. The volume level and/or the gain setting of the tone can vary based on the slide bar position of the MMI 304. A user can define the minimum perceptible level for each frequency band accordingly. Typically, the tuning process can start from the first band (Band 1) produced by the audio device 302 and continue up to the last band (Band N) produced by the audio device 302. The MMI 304 can send commands to the audio device 302 to produce a tone in the selected frequency bands. For example, through the selector switch, Switch 1 of the MMI 304 can be selected, and the audio device 302 can react accordingly by producing a tone of moderate frequency in Band 1. The user can adjust the volume or gain until the tone can be heard. The volume or gain can be set at a level of ideal hearing for the user. This is the minimum perceptible level of Band 1. The same process can be repeated for all other frequency bands (e.g. up to band N). For each of the bands, a loudspeaker associated with the audio device 302 can be matched to the hearing sensitivity of the user for the best hearing.

During the tuning process, the audio device 302 can store the gain setting of the multi-band filters at the minimum perceptible level defined by the user through the MMI 304 and store the settings according to the minimum perceptible level in memory or other storage device. The audio device 302 can apply the settings to the multi-band filter during a normal operation mode. After the tuning process, the user can use the audio device 302 in different levels of noise, and the audio device 302 can automatically adjust the loudness to match the environmental noise and the perception level of the user.

Figure 4:
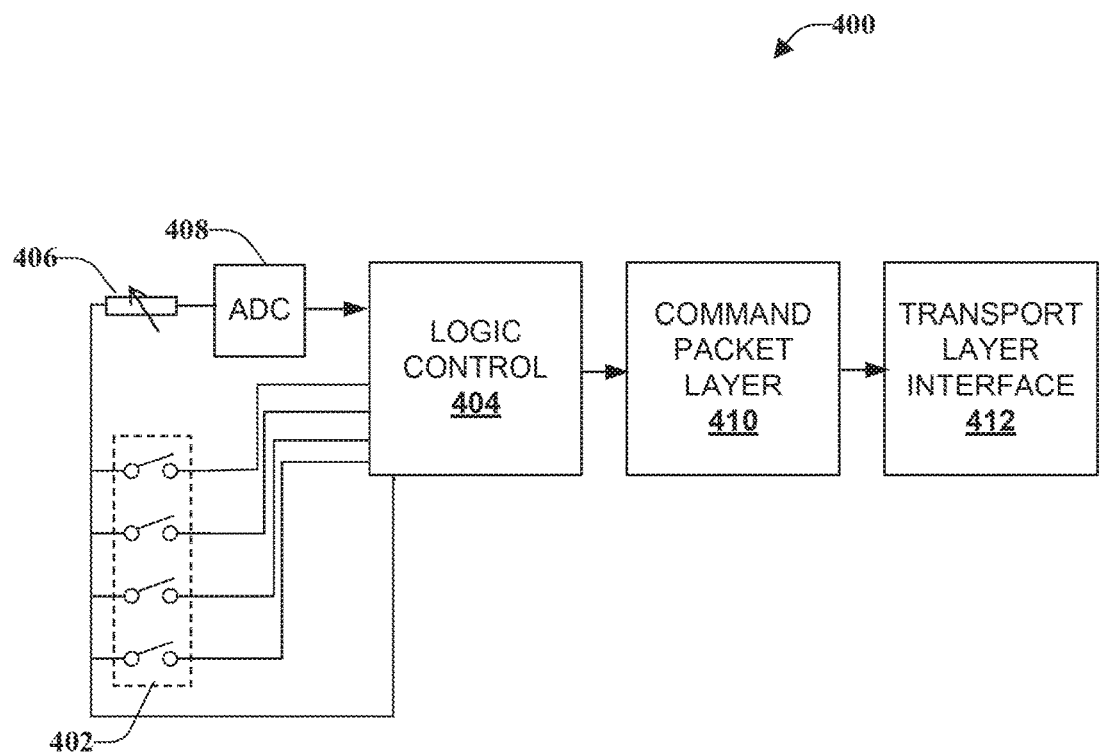
FIG. 4 illustrates a functional block diagram of an exemplary man machine interface.

Referring now to FIG. 4, illustrated is an exemplary MMI 304. The MMI 304 can include a control panel with selector switches (Sw1 to SW4) 402 that can connect to input/output (I/O) pins of a microcontroller 404 and a slider bar 406 that can connect to an I/O pin of the microcontroller 404. Each switch 402, when activated, selects an audio band (Sw1-Sw4 selects Band 1-Band 4) for tuning. The slider bar 406 can be a variable resistor connected to an analog to digital convertor (ADC) 408. The value of the ADC 408 can represent a level of the gain setting of the audio band selected by the switch 402.

The MMI 304 can also include a command packet generator 410. The command packet generator 410 can connect to an I/O pin of the microcontroller 404. The command packet generator 410 can gather information delivered by the ADC 408 and the selector switch 402 and convert the information into data packets suitable for transmission through the transport layer interface 412. The data packets can include at least the selected audio band and level settings derived from the ADC 410. The transport interface 412 is a physical transport layer that connects to the external device wired and/or wirelessly. The transport interface can be, for example, universal synchronous receiver/transmitter (UART), universal serial bus (USB) or BLUETOOTH™.

Figure 5:
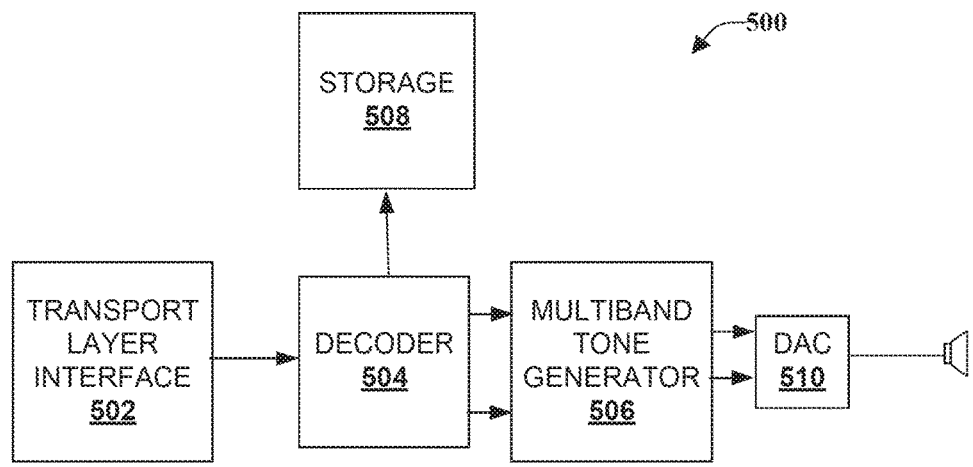
FIG. 5 illustrates a functional block diagram of an exemplary audio device in a training mode.

Referring now to FIG. 5, illustrated is functional block diagram of an exemplary audio device 302 in training mode. The audio device 302 can receive data packets from the transport later interface 502. The data packets can be sent to a decoder 504 to break the information down into at least the selected audio band (Band 1-Band 4 here in this example, but can be any number of Bands, N) and level settings.

The selected audio band and the level settings, as well as any other parameters, can be passed to the multi-band generator 506 and stored in a data storage space 508. The multi-band generator 506 can produce a tone at the selected band and level settings. The tone produced by the multi-band generator 506 can be in digital format, so it is sent to a digital to analog convertor (DAC) 510 to convert the digital data to an analog signal. The parameters from the output of the DAC 510 are also stored in the data storage space 506 and used by the multi-band filter 506 when the headset operates in a normal mode.

Figure 6:
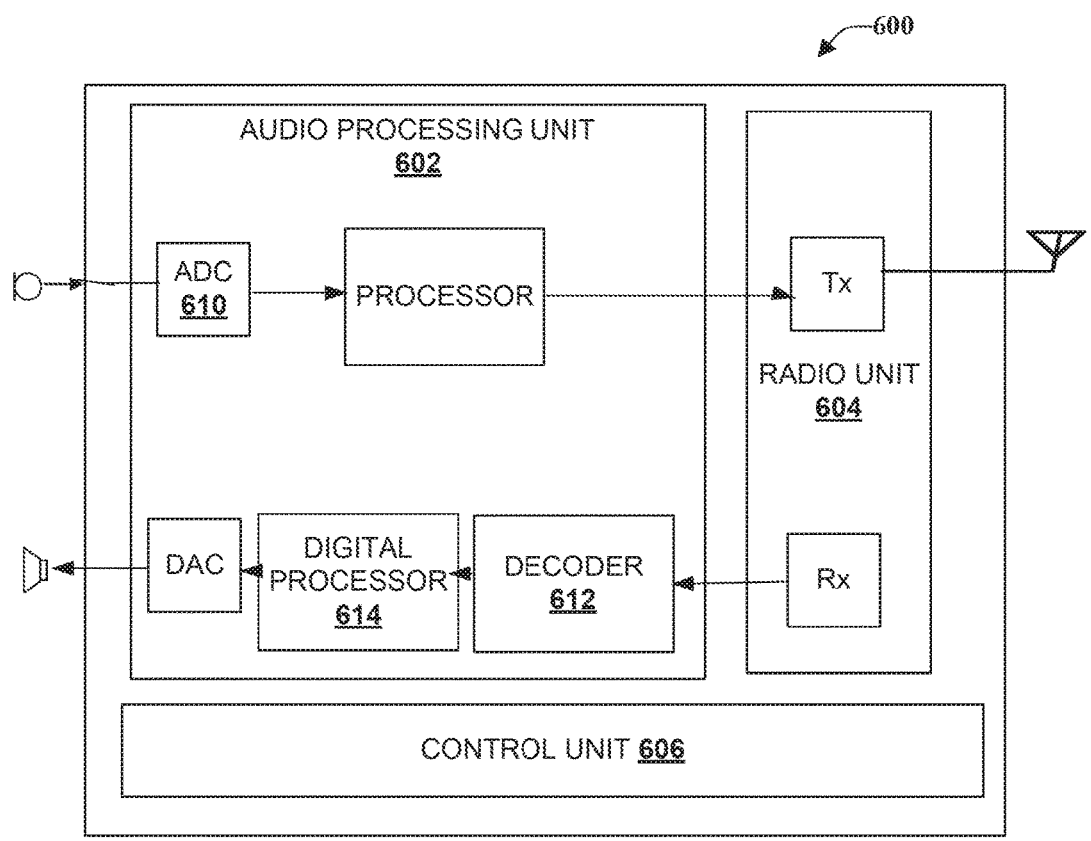
FIG. 6 illustrates a functional block diagram of an exemplary audio device in a normal mode.

Referring now to FIG. 6, illustrated is a functional block diagram exemplary audio device 302 in the normal mode. The audio device 302 includes three major functional blocks: an audio processing unit 602, a radio unit 604, and a logic control unit 606. The audio processing unit 602 can process the input/output audio. The radio unit 604 can provide the wireless capabilities for data exchange with a base station (e.g., via BLUETOOTH™). The logic control unit 606 can manage the flow control and interaction between different functional units.

For an audio input, a signal from an acoustic sensor 608 is converted to a digital form though an analog to digital convertor (ADC) 610 for further processing, such as echo cancellation or noise suppression. The processed signal can be then passed to the radio unit 604 to be transmitted to a base station (not shown).

At the receiving end of the radio unit 604, audio data received from a base station could have been pre-processed in a certain format, such as a compressed format or an encrypted format. The data is then passed to a decoder 612 that can perform an inverse function of the pre-processing. The data is then passed to a digital processor 614 that can transform the received time domain signal into a frequency domain signal utilizing a fast Fourier transform (FFT). The frequency domain signal can be then warped into a Bark Scale of M filter bands and the energy level in each of the Bark Scale frequency bands is estimated. Other filtering techniques, such as Fast Wavelet Transform, Quadrature Mirror Filter, and Linear Filter, can also be used in the digital processor 614 to achieve the same result.

Figure 7:
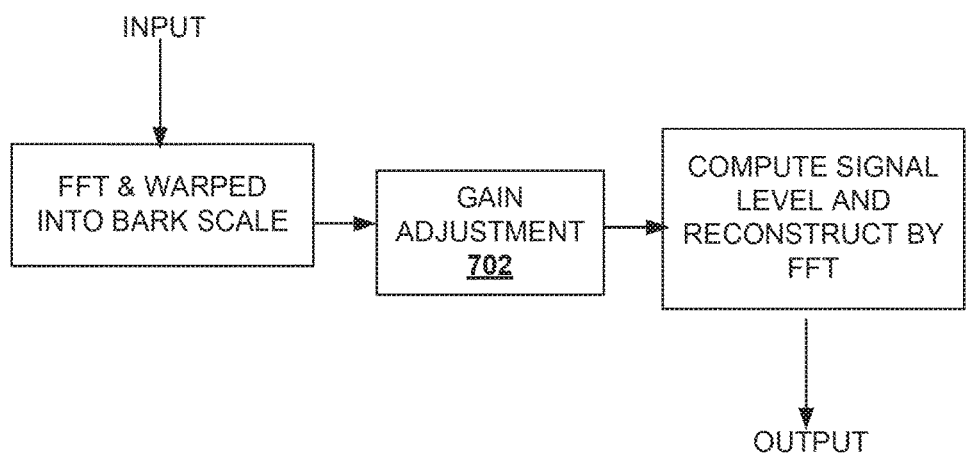
FIG. 7 illustrates a schematic block diagram of a Bark Scale filter bank.

Referring now to FIG. 7, illustrated is an example Bark Scale of M filter bands. M is one for ease of illustration in this example, and four in other examples, but it will be understood that M can be any number. Using a tuner device, such as the MMI 302, a user can manually adjust the signal strength in each of the bands until the audio is perceptible to the user for that particular band. The user can repeat the process for all of the bands and, for example, set the adjusted gain 702 for each of the M bands. The adjusted gain settings 702 can be different for individual users.

Figure 8:
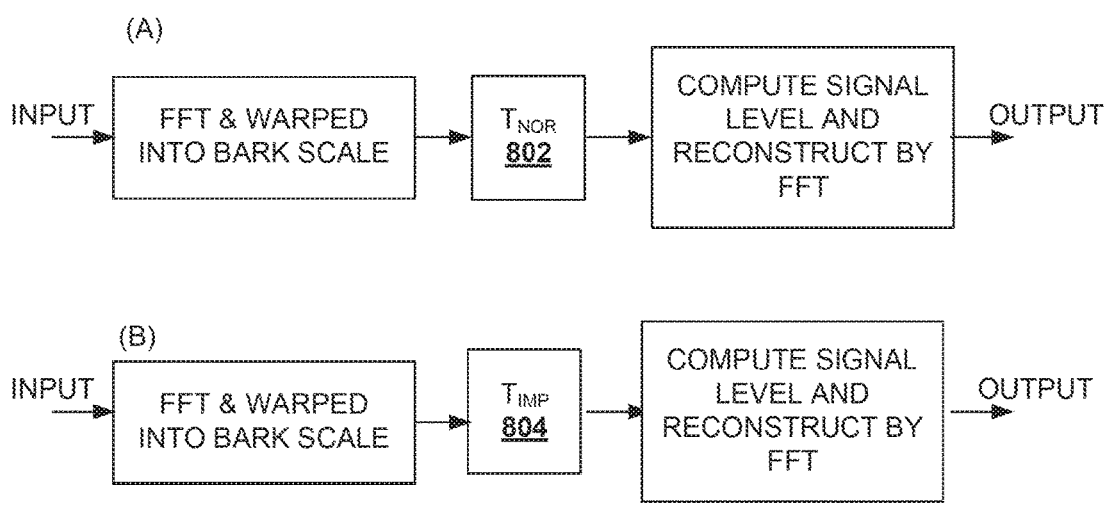
FIG. 8 illustrates a schematic block diagram of an input/output relationship for a theoretical normal user (A) and an actual user (B) for one of the frequency bands.

Referring now to FIG. 8, illustrated is an input/output relationship for a theoretical normal user (A) and an actual user (B) for one of the frequency bands. For a theoretical normal user, the hearing threshold for the theoretical normal ear 802 is $T_{NOR}$ and the maximum dynamic range hearing level of the normal ear is $C_{NOR}$. For an actual user, the hearing threshold for the ear 804 is $T_{IMP}$ and the maximum dynamic range hearing level for the ear is $C_{IMP}$.

If the real user has normal hearing in a quiet environment where the noise level is low, such as a quiet office, then $T_{IMP}=T_{NOR}$, and it is assumed that $C_{IMP}=C_{NOR}$. In this environment, the slope of the curve (A) will be 1, when:

$$A=(C_{imp}-T_{imp})/(C_{nor}-T_{nor}).\qquad\text{Equation 1}$$

When A=1, no correction is necessary.

Figure 9:
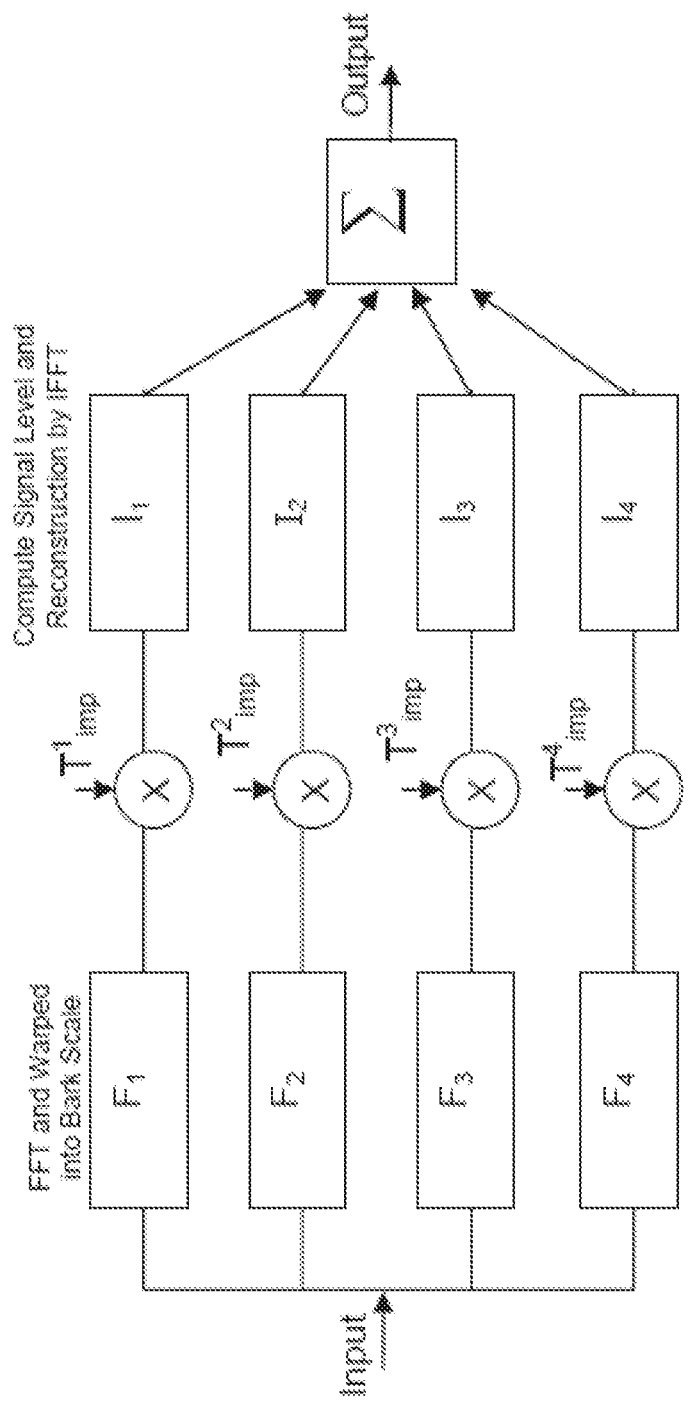
FIG. 9 illustrates a schematic block diagram of an input/output relationship for an actual user for four frequency bands.

Extrapolating FIG. 8 out to four bands, as illustrated in FIG. 9, for example, for a theoretical normal user, $T_{NOR}=[T^1_{NOR}\ T^2_{NOR}\ T^3_{NOR}\ T^4_{NOR}]$, and for a real user, $T_{IMP}=[T^1_{IMP}\ T^2_{IMP}\ T^3_{IMP}\ T^4_{IMP}]$, The values for $T_{IMP}$ can be set by the user during the tuning process.

The tuning process should be carried out in a normal and quiet environment. As shown in FIG. 1, for a user with a hearing impairment, the threshold for hearing ($T_{IMP}$) will normally be larger than the threshold for normal hearing ($T_{NOR}$) ($T_{IMP}>T_{NOR}$). If the tuning is carried out in a noisy environment, even for a user with normal hearing, the threshold for hearing ($T_{IMP}$) will also be larger than the threshold for normal hearing ($T_{NOR}$) ($T_{IMP}>T_{NOR}$) because the noise will naturally increase the hearing threshold, even in a normal user. If a device was tuned in a noisy environment, and then used in a quiet environment, the signal can be too loud for the hearing comfort of the same user. Accordingly, to prevent this incorrect baseline calculation and inevitable discomfort, the tuning should be carried out in a normal and quiet environment. This allows the baseline signal level to be set for a normal, quiet environment, while the baseline signal level can be corrected and adjusted for hearing in a noisy situation to maintain the loudness level.

The audio device can constantly estimate the noise level in the environment and correct the output accordingly. The audio device can employ any technique to estimate noise level. Noise estimation using the Minimum Statistic method is illustrated below.

The root-mean-square of the input microphone signal energy, $P_s$, can be found according to the following equation, where m(t) is the input microphone signal of the audio device and N is the number of time domain values:

$$P_s=\sqrt{1/N*\Sigma m(t)^2};\ t=1, 2, 3, \ldots N.\qquad\text{Equation 2}$$

Where σ is a value less than 1, the new root-mean-square value, $P_n$, can be determined based on an old root-mean-square value $P_{n\_old}$, as follows:

$$P_n\sigma*P_{n\_old}+(1-\sigma)*P_n.\qquad\text{Equation 3}$$

In the case where $P_n>P_{n\_old}$, a minimum root-mean-square value, $P_{min}$, or the noise level, can be found where η and μ are values less than 1, $$P_{min}=\eta*P_{min\_old}+\mu*(P_n-\beta*P_{n\_old}).\qquad\text{Equation 4}$$

In other cases, $$P_{min}=P_n;\qquad\text{Equation 5}$$

If the tuning is done in a quiet environment, $T_{IMP}$ can be set to a baseline value. If the noise level for the environment increases, the audio device can estimate the new $T_{IMP}$ ($T_{IMPNEW}$) as follows, where $VdB_n$ is the signal level of the loudspeaker in decibels:

$$T_{IMPNEW}=VdB_n+T_{IMP}-T_{NOR}.\qquad\text{Equation 6}$$

Where N is the number of time domain values and $s_{pk}(t)$ is the signal of the loudspeaker, the root-mean-:square value for V can be found according to:

$$V_{rms}=\sqrt{1/N*\Sigma s_{pk}(t)^2}\ t=1,2.\ldots N.\qquad\text{Equation 7}$$

The relationship between $VdB_s$, the input signal, of the signal and $V_{rms}$ of Equation 7 is:

$$VdB_s=20*\log(V_{rms}).\qquad\text{Equation 8}$$

The slope (A) of the new curve for the noisy environment can be computed as:

$$A=(C_{IMP}-T_{IMPNEW})/(C_{NOR}-T_{NOR}).\qquad\text{Equation 9}$$

The adjusted output signal level of the loudspeaker in decibels is now given as follows, where $VdB_s$ is the input signal whose level needs to be adjusted to increase the loudness of the loudspeaker to enhance the listening for the noise level:

$$VdB_{out}=T_{IMPNEW}+A*(VdB_s-T_{NOR}).\qquad\text{Equation 10}$$

The final output signal gain, G, that needs to compensate for the increased noise level can be computed as follows:

$$G=10^{\wedge}(VdB_{out}/20)/V_{rms}.\qquad\text{Equation 11}$$

The final output signal can be computed according to the gain, G, and the signal of the loudspeaker $s_{pk}(t)$:

$$Y=G*s_{pk}(t).\qquad\text{Equation 12}$$

One example audio device can include a hands-free speakerphone system equipped with embedded microphones with capabilities including audio signal acquisition, echo cancellation, interference sound cancellation, noise cancellation and wind noise resistance. Conventional audio devices, such as a single piece hands-free car-kit or a BLUETOOTH™ headset, are typically designed using a single omni-directional microphone to pick up the voice of the user. The omni-directional microphone can also pick up all the sounds in the vicinity that can distort the speech of the user, making the use of the device in a noisy environment, such as inside the shopping mall or on a bus or a train, very difficult.

In order to reduce ambient noise, a boom microphone can be attached to the headset. While such design provides a voice input channel to the headset, the 'boom' of the microphone imposes an awkward ID issue to the overall appearance of the headset. Also the design of 'boom' microphone normally involves movable mechanical parts; which can affect the durability of the device and the manufacturing cost of the device. Additionally, in a hands-free car system, the boom microphone is not practical.

Recently, a small array has been proposed to be used in a small mobile device, such as headset, with some success. The small array includes two omni-directional microphones spaced at about 2.1 cm apart for a 16 KHz sampling frequency. For an 8 KHz sampling rate the spacing between the microphones must be doubled to 4.2 cm. The small array forms a beam that points at the user's mouth; it can also form an area on its back plane to nullify an interference source. However, the small array is only effective for a near field source. Further, the 2.1 cm spacing requirement can also be a challenge for small mobile device, in that it can be the bottleneck for ID issues.

Additionally, all these devices still face a very serious challenge: wind noise. Directional microphones, such as cardioids microphones or bidirectional microphones, are extremely susceptible to wind noise. Even a moderate level of wind noise can render these devices unusable.

To solve at least these problems, described herein is a micro-array that can utilize two or three microphones depending on the number of beams that are needed. The two or three microphones can be closely spaced, and even placed on top of each other so that the spacing between the microphones can be zero. This can ease the bottleneck for ID issues for almost all mobile devices. Furthermore, the micro-array can be effective for both near-field and far-field applications. Additionally, a unique microphone compartment can house the array with the multi-microphones placed closely together and can also minimize wind noise.

Figure 10:
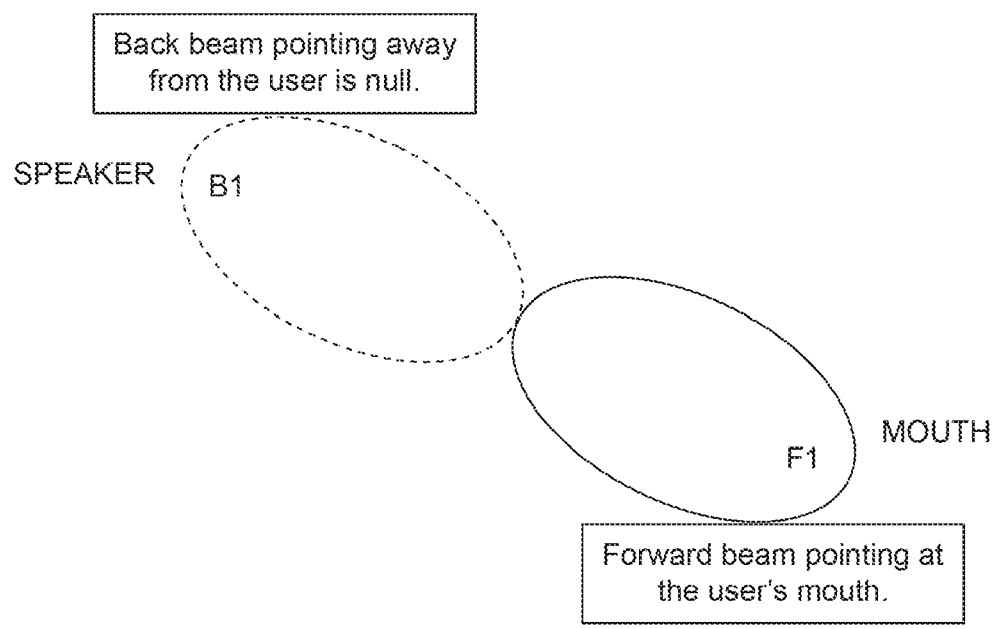
FIG. 10 illustrates an arrangement of two microphones in an exemplary audio device.

Referring now to FIG. 10, illustrated is an arrangement of the two microphones to form a single beam pointing at the mouth of the user F1. Another beam can be formed pointing in the opposite direction B1 as shown by the dotted line in FIG. 10. A typical application of this arrangement is, for example, a BLUETOOTH™ headset. The headset can include a unique wind resistant microphone compartment design that can allow the sound particles to flow through the fabric and can facilitate diffusion of the turbulent wind. The turbulent wind can be diffused when it enters the microphone compartment and can become white noise. In this manner wind noise can have little to no impact on the microphones inside the compartment.

The microphones can be mounted either on top of one another or side-by-side to each other. Through digital signal processing techniques, a beam can be formed that can cover the direction of the mouth with beam-forming methods. Within the sweet zone, signals from a mouth location of a user can be picked up, while the interference signal originating outside the beam, such as the surrounding noise, can be cancelled. The adaptive noise suppression further enhances the signal to noise ratio of the user's speech and produces a clear signal with minimum noise. This output signal is suitable for communication and speech recognition.

Due to the close proximity between the microphone and the headset speaker in a BLUETOOTH™ headset, echo resulting from acoustic coupling is inevitable when the headset is used in communication mode. In this case, a null can be created by rejecting the beam pointing toward the loudspeaker B1. This can have applications, for example with voice control navigation for entertainment. In this embodiment, a user can be listening to music while giving voice commands to a base station. The music playback can be through the headset, and the microphones can pick the music up as interference noise. The beam-forming can cancel the interference due to music in most cases. Another way of getting rid of acoustic echo is through direct filtering where of both the audio data to the speaker and from the acoustic sensor are available, the echo can be cancelled out using a digital filter, and the beam-forming can help to eliminate the acoustic echo generated by non-linearity of the loudspeaker or the mechanics of the system that is beyond the capability of direct filtering.

Figure 11:
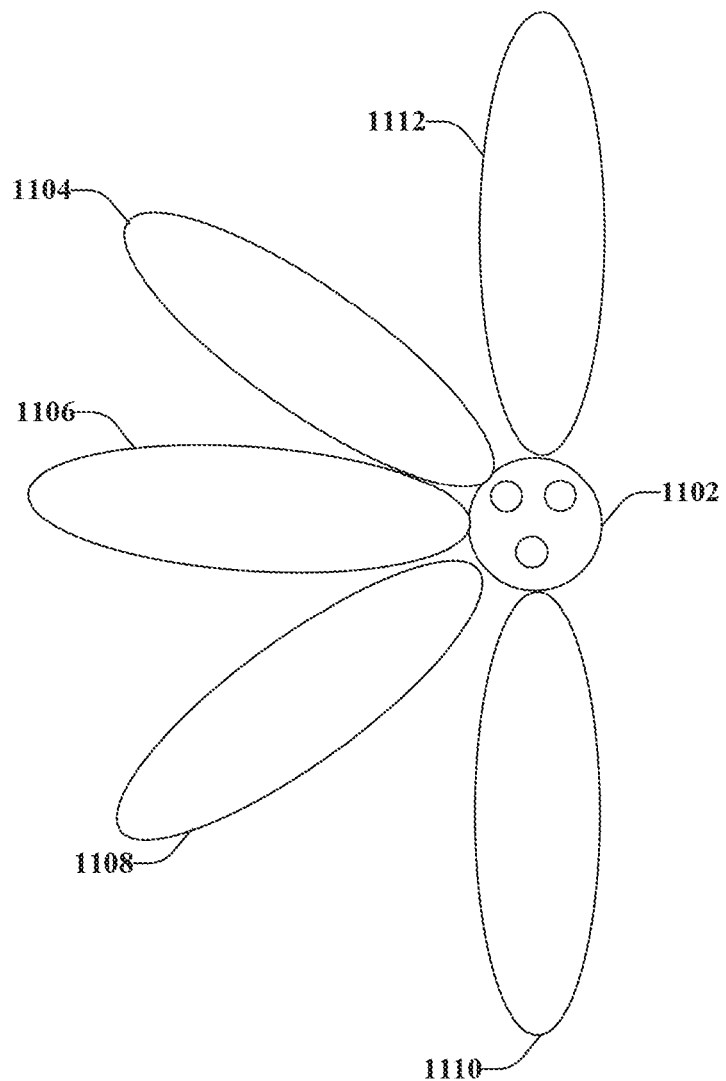
FIG. 11 illustrates an arrangement of three microphones in an exemplary audio device.

Referring now to FIG. 11, illustrated is an arrangement of three microphones 1102 can form a total of five beams. Five beams are shown for ease of illustration only; the beams could be any number less than or equal to eight. Three of the beams 1104, 1106, 1108 can point toward the backseat passengers, one beam 1110 can point toward the front passenger and the other beam 1112 can point to the driver. This configuration can be utilized for an audio conference inside a conference room or inside a car. Although not shown, as many as eight beams can be formed using the configuration of the three microphones 1102

Figure 12:
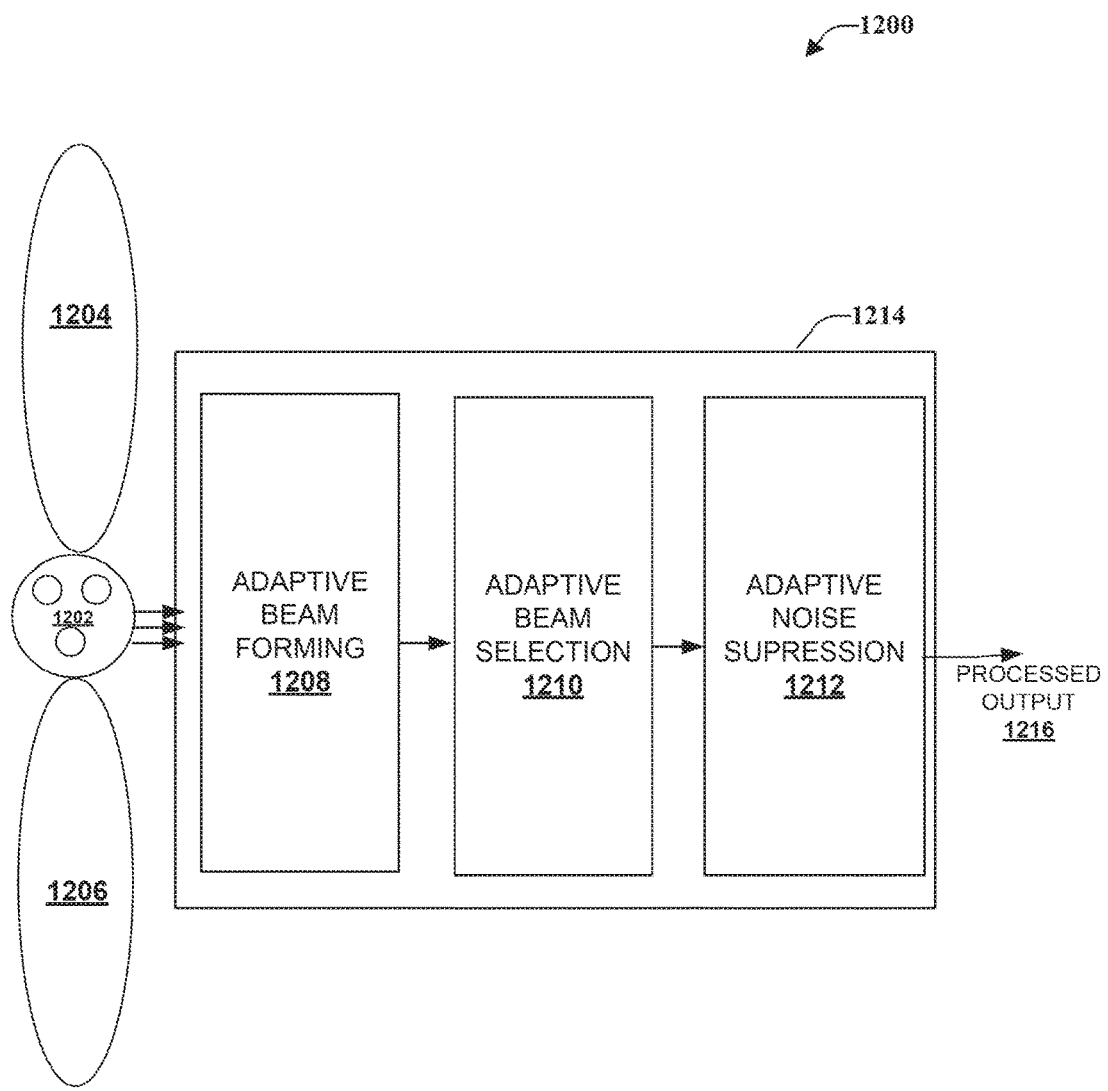
FIG. 12 illustrates a functional block diagram of an exemplary audio device.

Referring now to FIG. 12, illustrated is a functional block diagram of a system 1200 capable of acquiring an acoustic signal utilizing three acoustic sensors 1202 (e.g., microphones) in any hands-free application. An example of a hands-free application can include a hands-free car kit. System 1200 can include a beam pointing at the driver 1202 and a beam pointing at the passenger 1204 in a theoretical hands-free car kit. Only two beams 1204, 1206 are illustrated in system 1200, but this is merely for simplicity of illustration. As many as eight beams can be formed by the three acoustic sensors 1202.

The three acoustic sensors 1202 can sense a voice of a user. The acoustic sensors 1202 can also sense noise, including interference noise, ambient noise, and circuit noise. The voice and noise can be sent to a signal processor 1214. The signal processor can include an adaptive beam forming component 1206, an adaptive beam selection component 1208 and an adaptive noise suppression component 1210.

The signal is sent to the adaptive beam forming component 1206 where beams are formed improving the voice, but keeping the noise. For example, beams can be formed for the voice and the noise. The improved voice and the noise beams can be further processed by the adaptive beam selection component 1208. The adaptive beam selection component 1208 can eliminate interference noise while further improving voice quality. For example, the beam selection component 1208 can eliminate select only the beams with the voice while eliminating the beams with interference noise. The adaptive noise suppression component 1210 can suppress the remaining noise while optimizing the voice. Accordingly, the processed output 1216 can include the optimized voice with minimal noise.

Figure 13:
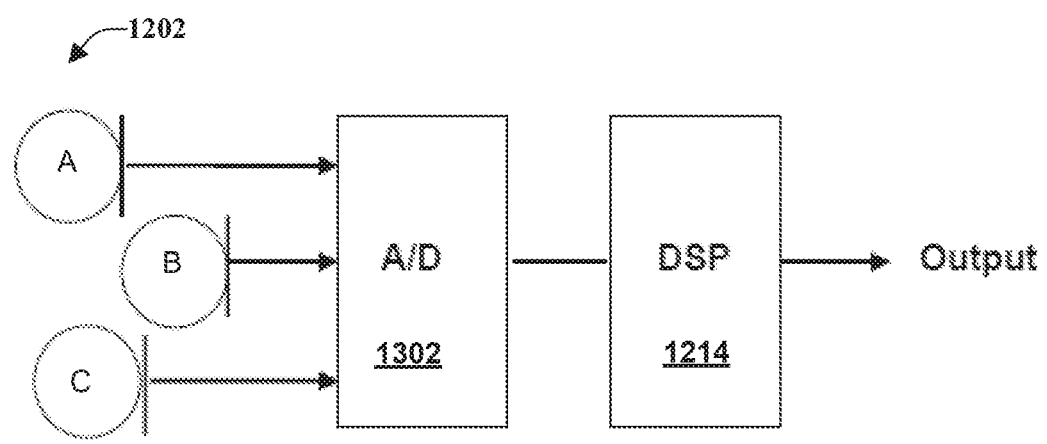
FIG. 13 illustrates an arrangement of three audio sensors in an exemplary audio device.
Figure 14:
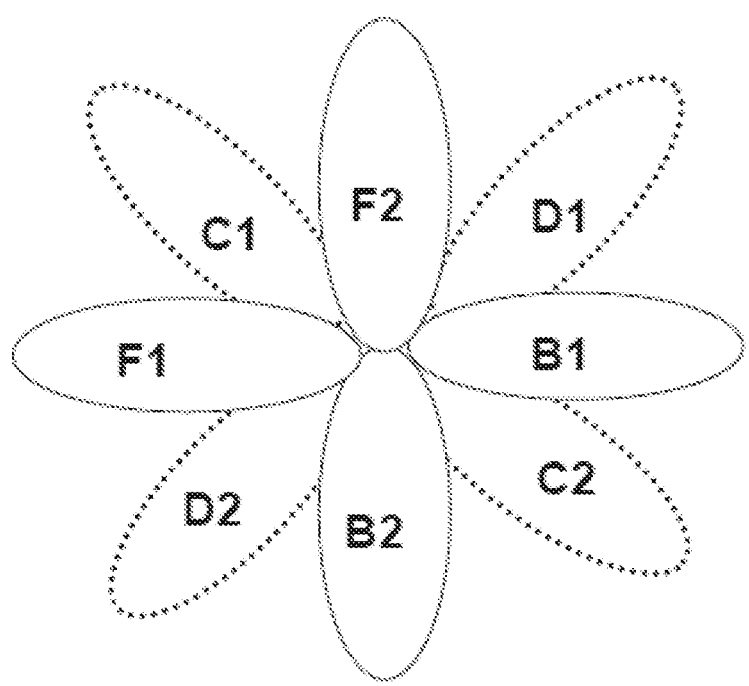
FIG. 14 illustrates an arrangement of beams formed in an exemplary audio device.

Referring now to FIG. 13, illustrated is an example layout and positioning of the three acoustic sensors 1202. The three acoustic sensors A, B, C can be spaced as close to each other as necessary due to size constraints. The three acoustic sensors A, B, C can even be placed on top of each other if size constraints so require. There are no constraints as physical placement and arrangement of the three acoustic sensors A, B, C. The signal sensed by the three acoustic sensors A, B, C can undergo analog to digital conversion through an analog to digital (A/D) component 1302 and the signal can undergo digital signal processing as described above through a digital signal processor 1214. Using three microphones, a total of eight beams F1, F2, B1, B2, C1, C2, D1, and D2 can be formed to point to all of a 360 degree angle as illustrated in FIG. 14. However, fewer than all eight beams can be generated.

Figure 15:
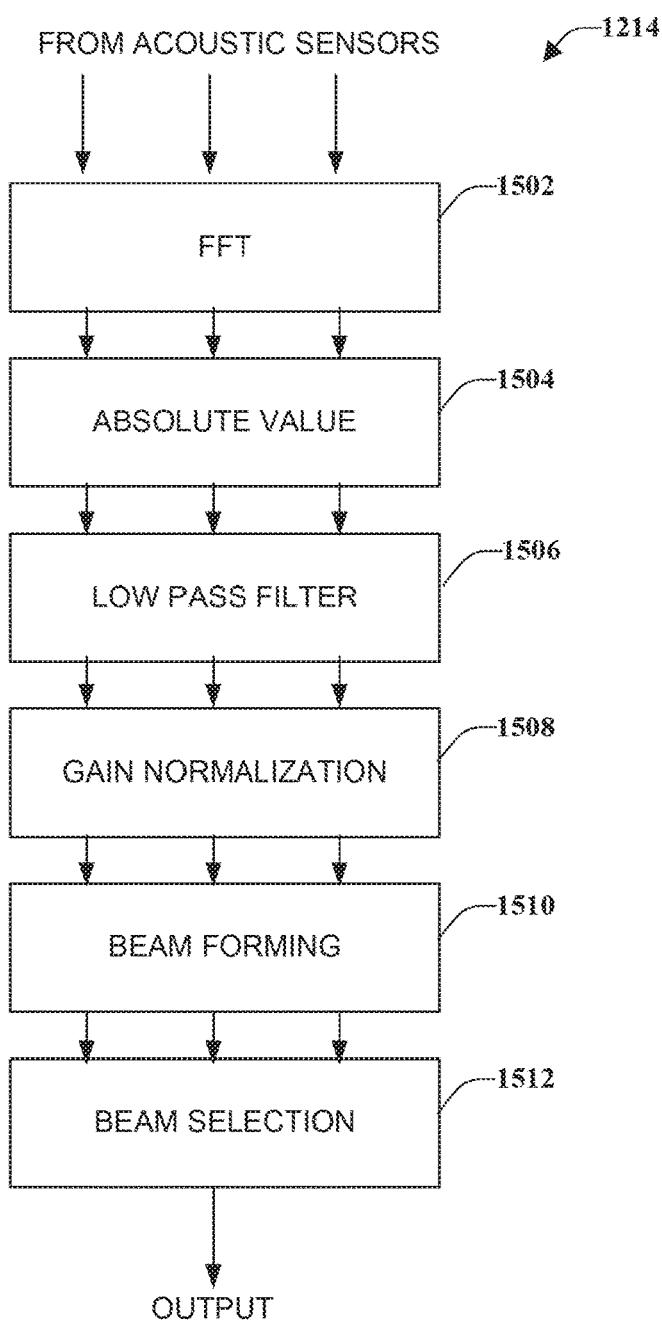
FIG. 15 illustrates a system block diagram of a digital signal processor that can be utilized in an exemplary audio device.

Referring now to FIG. 15, illustrated is a system block diagram of the digital signal processor 1214. The digital signal processor 1214 can receive a signal from three acoustic sensors. The signal can be represented as x(t), y(t), z(t). The signal can undergo a Hanning window (not shown). This signal x(t), y(t), z(t) can be processed by a FFT component 1502. The signal undergoes a fast Fourier transform in the FFT component 1502 to become x(f), y(f), and z(f).

$$x(f)=fft[x(t)] \quad \text{Equation 13}$$

$$y(f)=fft[y(t)] \quad \text{Equation 14}$$

$$z(f)=fft[z(t)] \quad \text{Equation 15}$$

The signal x(f), y(f), z(f) can be further processed by an absolute value component 1504 that can process the signal by taking the absolute value and becoming x(k), y(k), z(k).

$$x(k)=|x(f)| \quad \text{Equation 16}$$

$$y(k)=|y(f)| \quad \text{Equation 17}$$

$$z(k)=|z(f)| \quad \text{Equation 18}$$

The signal x(k), y(k), z(k) can be further processed by a low pass filter component 1506 as follows:

$$x_s(k)=\alpha x_s(k)+(1-\alpha)x(k) \quad \text{Equation 19}$$

$$y_s(k)=\alpha y_s(k)+(1-\alpha)y(k) \quad \text{Equation 20}$$

$$z_s(k)=\alpha z_s(k)+(1-\alpha)z(k) \quad \text{Equation 21}$$

where 0 is less than α is less than 1.

The signal $x_s(k)$, $y_s(k)$, $z_s(k)$ can be further processed by the gain normalization component 1508 using $y_s(k)$ as reference. Although $y_s(k)$ is utilized as a reference herein, any of $x_s(k)$, $y_s(k)$, or $z_s(k)$ can be a reference.

$$A_x(k)=y_s(k)/x_s(k) \qquad \text{Equation 22}$$

$$A_z(k)=y_s(k)/z_s(k) \qquad \text{Equation 23}$$

The signal formed through the gain normalization component 1508 (e.g., $A_x(k)$ and $A_z(k)$) can be utilized to form beams (e.g., the eight beams of FIG. 14) by the beam forming component 1510.

$$F1(f)=y(f)+A_x x(f) \qquad \text{Equation 24}$$

$$B1(f)=y(f)-A_x x(f) \qquad \text{Equation 25}$$

$$F2(f)=y(f)+A_z z(f) \qquad \text{Equation 26}$$

$$B2(f)=y(f)-A_z z(f) \qquad \text{Equation 27}$$

$$C1(f)=y(f)+(A_x x(f)+A_z z(f))0.7071 \qquad \text{Equation 28}$$

$$C2(f)=y(f)-(A_x x(f)+A_z z(f))0.7071 \qquad \text{Equation 29}$$

$$D1(f)=y(f)+(A_x x(f)-A_z z(f))0.7071 \qquad \text{Equation 30}$$

$$D2(f)=y(f)-(A_x x(f)-A_z z(f))0.7071 \qquad \text{Equation 31}$$

The beam selection component 1512 can select between the beams formed by the beam forming component 1510 (e.g., F1, B1, F2, B2, C1, C2, D1, D2) to produce an output with an optimize voice and minimized noise. For example, in the automotive setup as illustrated in FIG. 11, it is unlikely that the driver, the front passenger, and the backset passengers will all talk to be detected at the same time (the others can talk, for example, to each other, but these voices are often background noise). Accordingly, it becomes necessary to select the beam that contains the speech signal rather than the noise. The beam selection component 1512 can conduct a stage voice activity detection for all of the beams and determine which beams have speech activities.

Assume that the beam selection component 1512 detects a speech activity in beams F1 and B1. The beam selecting component 1512 can compute the front to back ratio.

$$FBR1=|F1(f)|/|B1(f)| \qquad \text{Equation 32}$$

Then it can be determined through a loop for values of FBR1 between 1 and an integer N, if FBR1 is greater than 1, FV(i) is equal to 1 and in all other conditions FV(i)=0.001. The beam F1 can be computer according to FBV1 and FV.

$$FBV1=FV*F1 \qquad \text{Equation 33}$$

The noise suppress gain, G, can be computed by any known noise suppression algorithm. The output FBV01 from one beam can be given as:

$$FBV01=G*FBV1, \qquad \text{Equation 34}$$

and the final output can be computed as the minimum of each of the frequency bins of three possible signals in the frequency bin of three possible signals in the frequency domain.

$$F_{out}(f)=\min(|FBV01|;|y(f)|;|A_x x(f)|) \qquad \text{Equation 35}$$

The actual perceived output can be a time domain signal given according to the inverse fast Fourier transform of: $F_{out}(f)$ scaled by a complex number reconstructed using a standard overlap add approach.

$$S_{out}(t)=ifft(F_{out}*\exp(j*\Theta)), \qquad \text{Equation 36}$$

where $\Theta$ is the phase angle of $y(f)$ and $j$ is a standard complex number.

FIGS. 16-21 illustrate methods and algorithms that can be utilized in connection with any audio device or system described above. For simplicity of explanation, the methods and algorithms are depicted and described as a series of acts. It is to be understood and appreciated that the various embodiments are not limited by the acts illustrated and/or by the order of acts. For example, acts can occur in various orders and/or concurrently, and with other acts not presented or described herein. Furthermore, not all illustrated acts can be required to implement the methods and algorithms as described herein. In addition, those skilled in the art will understand and appreciate that the methods and algorithms could alternatively be represented as a series of interrelated states via a state diagram or events. Additionally, it should be further appreciated that the methods described hereafter are capable of being stored on an article of manufacture (e.g., a computer readable storage medium) to facilitate transporting and transferring such methodologies to computers. The term article of manufacture, as used herein, is intended to encompass a computer program accessible from any computer-readable device, carrier, or media. For example, these methods and/or algorithms can be executed by the processor associated with the audio device 302 and/or the processor associated with the MMI 304.

Figure 16:
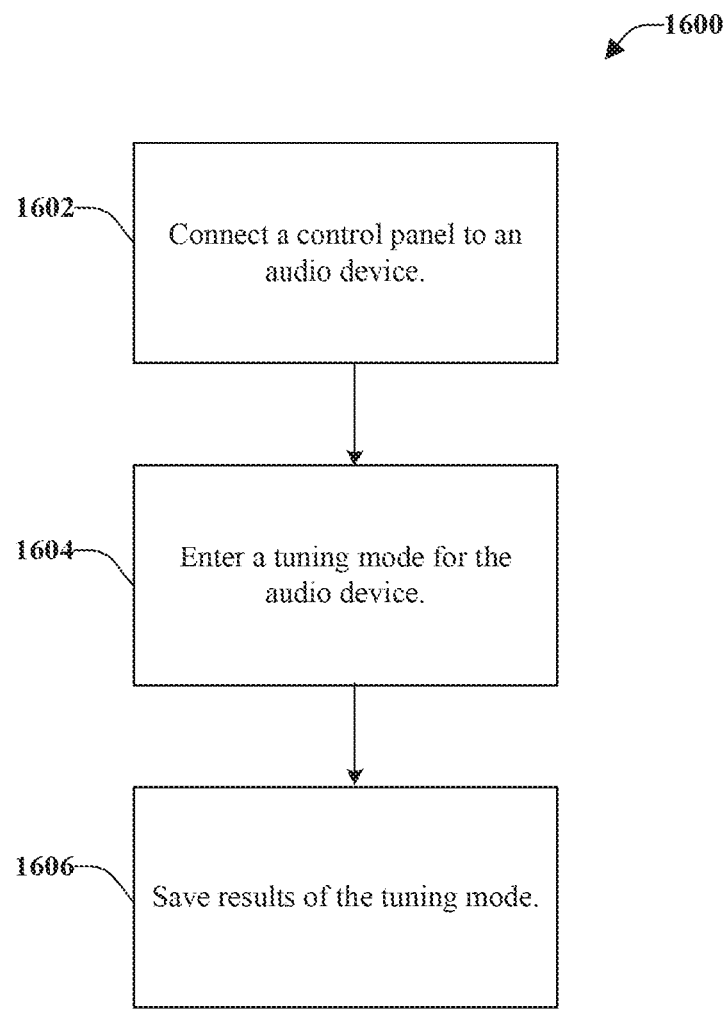
FIG. 16 illustrates a process flow diagram of a method for tuning an audio device.

Referring now to FIG. 16, illustrated is a process flow diagram of a method 1600 for tuning an audio device. Tuning an audio device can refer to allowing a user to discover a minimum perceptible level of hearing sensitivity specific the user at different audio frequency bands with respect to the audio device. At element 1602, a control panel can be connected to the audio device for the purpose of training the audio device for the user. The control panel can include a mechanism (e.g., slide bar) that can allow the user to change a volume of an audio signal and a mechanism (e.g., buttons) that can allow the user to choose an audio frequency so that the user can adjust the audio signal of the audio device to match a hearing level of the user. The control panel can be connected to the audio device through a wired or a wireless connection.

At element 1604, the audio device can enter a tuning mode in which the audio device can be trained according to the hearing level of the user. During the tuning mode, the control panel can allow a user to adjust a level (e.g., volume) setting of the audio device for various frequencies. In the tuning mode, the audio device can produce a tone based on the frequency band selected by the user. The user can define the minimum perceptible level for each frequency band accordingly (e.g., by changing the volume to a comfortable level). At element 1606, the audio device can store the minimum perceptible level for the user so that the audio device can automatically adjust according to the minimum perceptible level in different levels of noise during normal operation.

Figure 17:
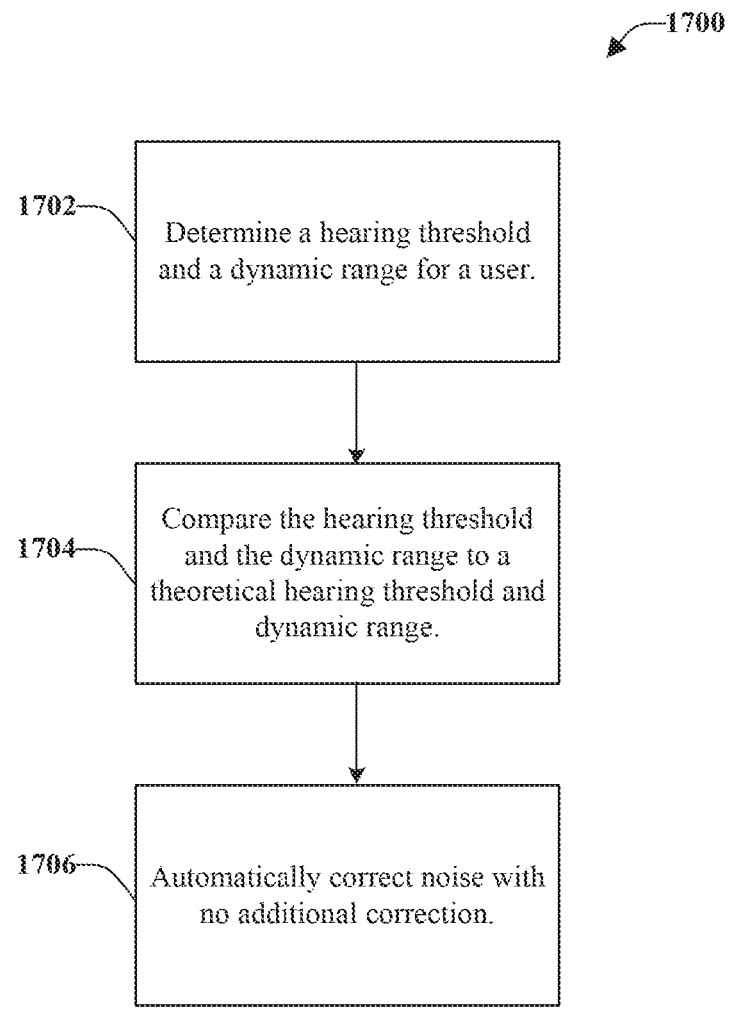
FIG. 17 illustrates a process flow diagram of a method for tuning an audio device for a user with normal hearing.

Referring now to FIG. 17, illustrated is a process flow diagram of a method 1700 for tuning an audio device for a user with normal hearing for a frequency. This method 1700 should be performed in a normal, quiet environment or else the values will be skewed according to noise in the room. At element 1702, a hearing threshold and a dynamic range hearing level are determined for the user at the frequency according to the minimum perceptible range (e.g., defined by setting the volume for a sound from the frequency). At element 1704, the values for the user of the threshold and the dynamic range can be compared to a theoretical threshold and a theoretical dynamic range for a normal ear. The threshold and the dynamic range for the user should be about equal to the theoretical values. Accordingly, at element 1706, the audio device can automatically correct for the noise with no additional correction value due to the threshold of the user.

Figure 18:
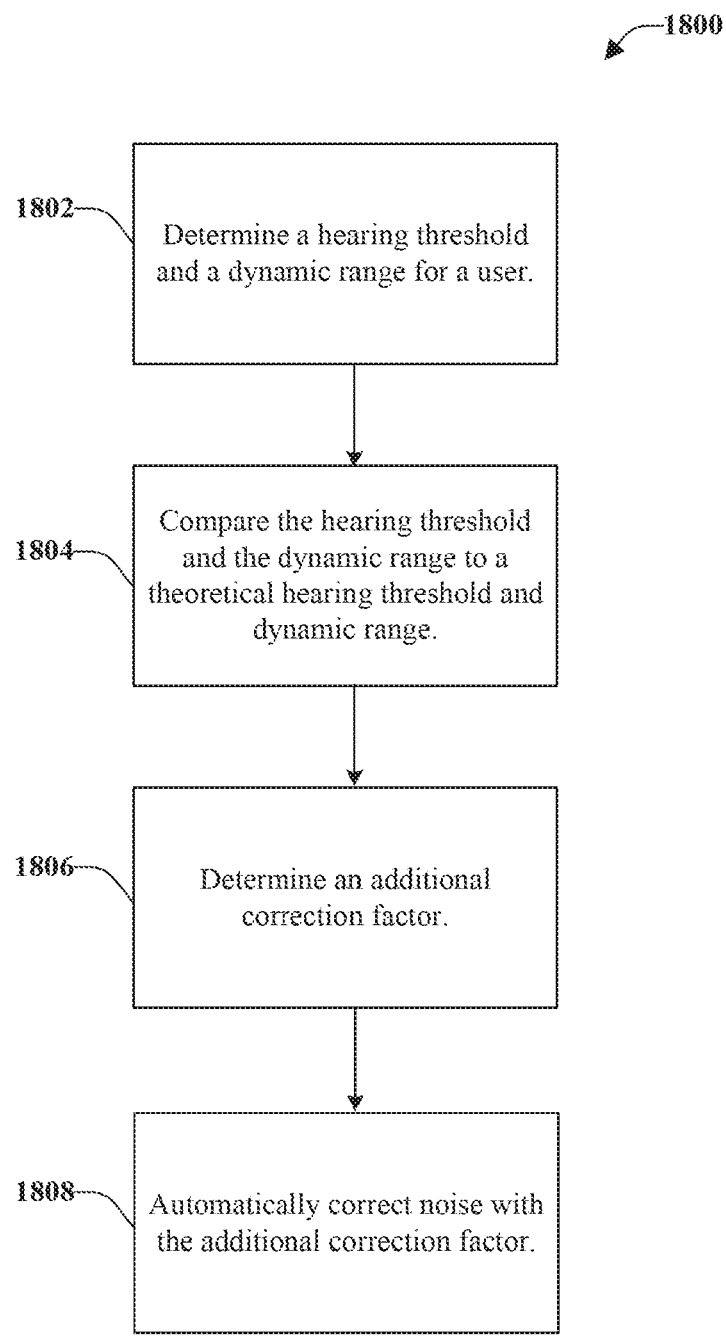
FIG. 18 illustrates a process flow diagram of a method for tuning an audio device for a user with impaired hearing.

Referring now to FIG. 18, illustrated is a process flow diagram of a method 1800 for tuning an audio device for a user with impaired hearing. At element 1802, a threshold for hearing and a dynamic range are determined for the user. At element 1804, the values for the user of the threshold and the dynamic range can be compared to a theoretical threshold and a theoretical dynamic range for a normal ear. The user with a hearing impairment generally has a higher threshold for hearing than the threshold for normal hearing. Accordingly, at element 1806, an additional correction factor can be determined based on the threshold for the user. At element 1808, the audio device can automatically correct for the noise in an environment with the additional correction value due to the threshold of the user.

Figure 19:
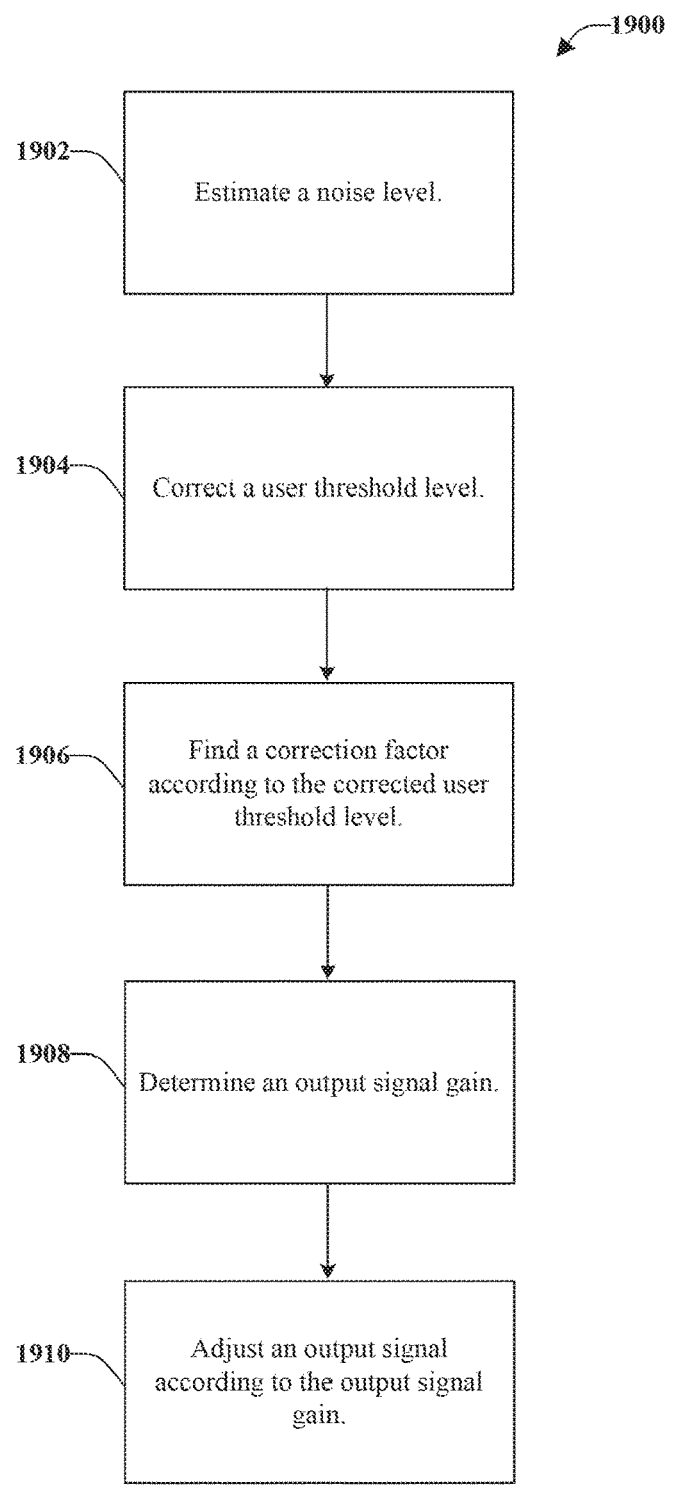
FIG. 19 illustrates a process flow diagram of a method for correcting noise based on a user's minimum perceived level.

Referring now to FIG. 19, illustrated is a process flow diagram of a method 1900 for correcting noise in an output based on a user's minimum perceived level. An audio device can constantly estimate the noise level in the environment and correct the output accordingly. At element 1902, noise can be estimated (e.g., according to the Minimum Statistic noise estimation method). At element 1904, a threshold value for the user can be corrected based on the signal level of the loud speaker, the recorded threshold for the user, and the theoretical normal threshold. At element 1906, the correction factor can be found according to the new threshold, the dynamic range of the user, and the theoretical dynamic range and threshold. The new corrected output signal level of the speakers can be found according to the new threshold, the correction factor, and the difference between the old output signal level of the speakers and the theoretical threshold. At element 1908, an output signal gain that is needed to compensate for the increased noise level is found according to the output signal level and the noise. At element 1910, a final output signal can be adjusted according to the gain.

Figure 20:
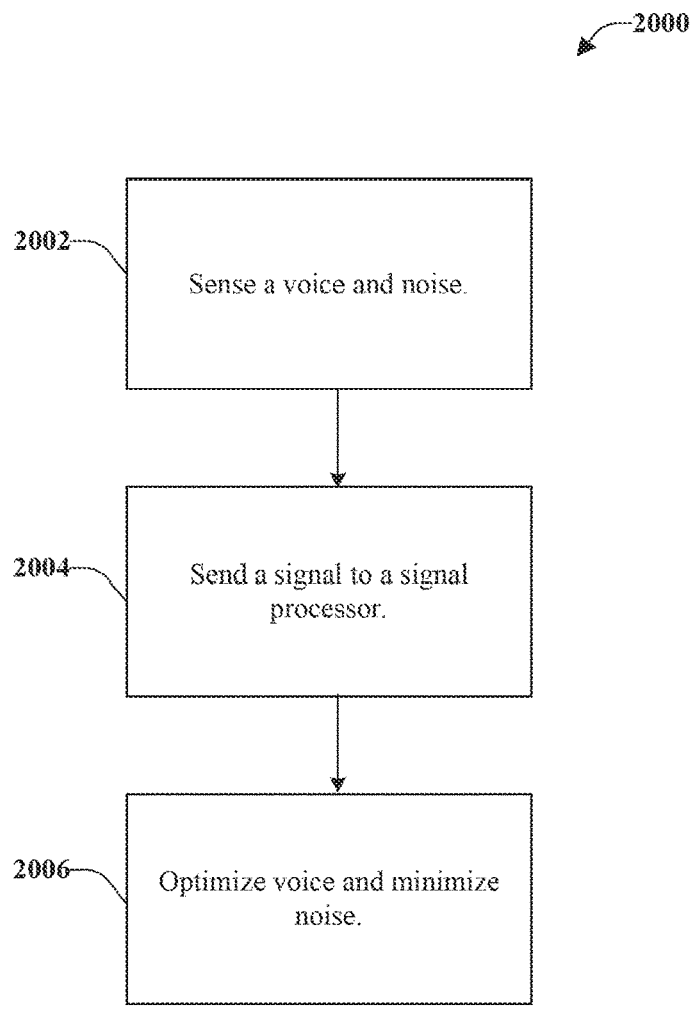
FIG. 20 illustrates a process flow diagram of a method for acquiring an acoustic signal detected by an audio device.

Referring now to FIG. 20, illustrated is a process flow diagram of a method 2000 for acquiring an acoustic signal in an audio device. The audio device can utilize three acoustic sensors arranged in any orientation. At element 2002, the acoustic sensors can sense a voice of a user along with accompanying noise. At element 2004, the acoustic sensors can send a signal including the voice and the noise to a digital signal processor. At element 2006, the digital signal processor can maximize voice quality while minimizing noise in the signal.

Figure 21:
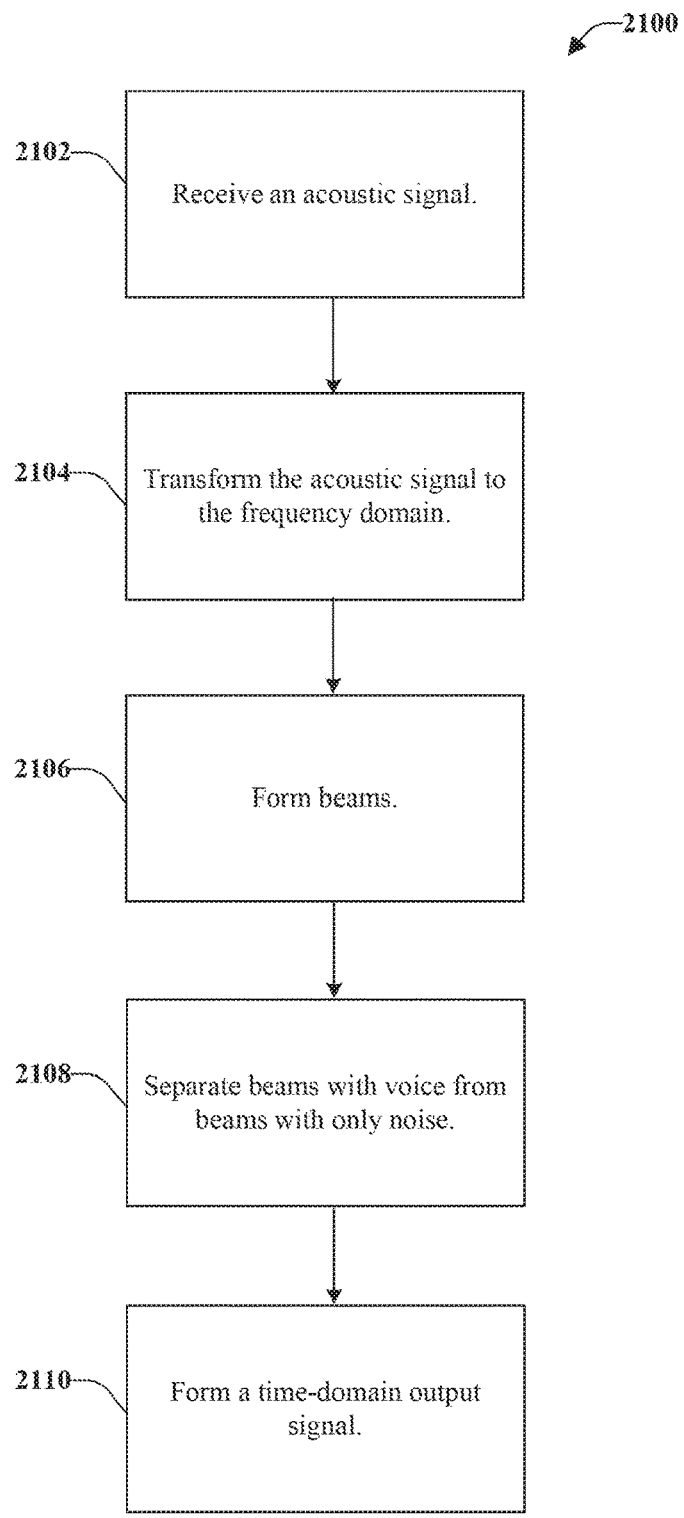
FIG. 21 illustrates a process flow diagram of a method for minimizing noise in an acoustic signal detected by an audio device.

Referring now to FIG. 21, illustrated is a process flow diagram of a method 2100 for minimizing noise in an acoustic signal detected by an audio device. At element 2102, an acoustic signal can be received from three acoustic sensors at a digital signal processor. At element 2104, the time domain acoustic signal received from the sensors can be converted to a frequency domain signal (e.g., by fast Fourier transform). At element 2106, beams can be formed. For example, eight or fewer beams can be formed. At element 2108, beams with the voice signal can be separated from beams with only a noise signal. At element 2110, after further processing, the beams with the voice signal can undergo an inverse fast Fourier transform to form a time domain output signal.

Figure 22:
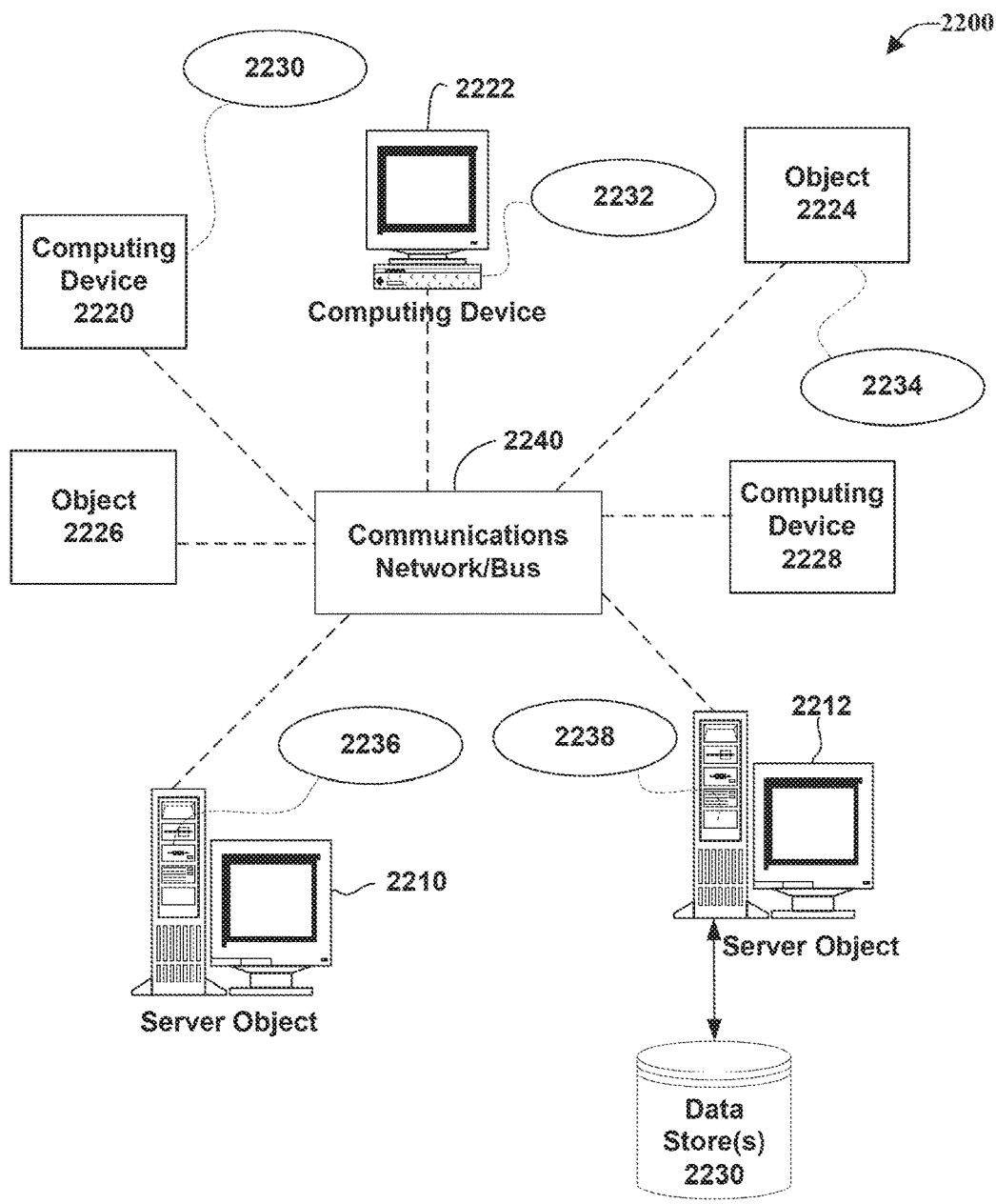
FIG. 22 illustrates an exemplary computer network in which various embodiments described herein can be implemented.
Figure 23:
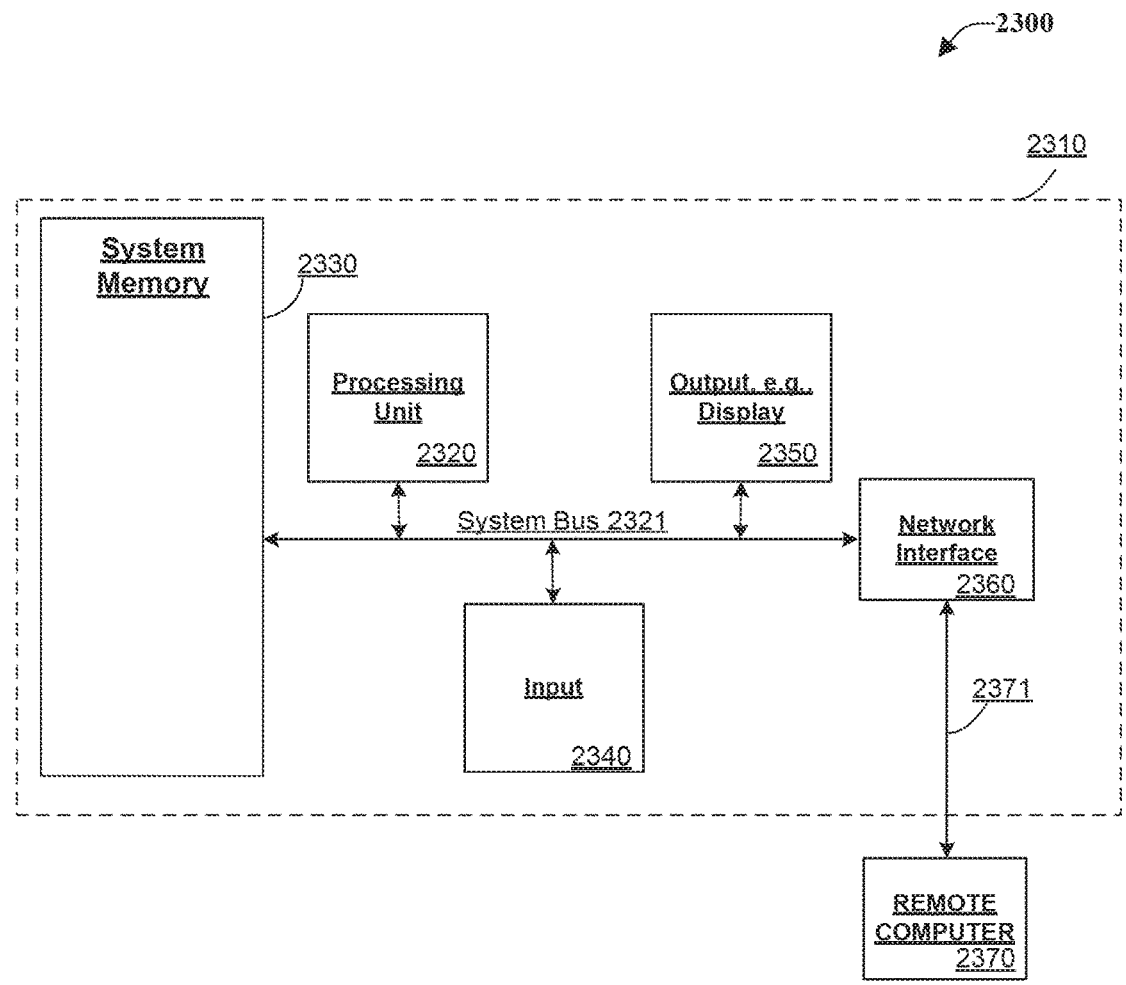
FIG. 23 illustrates an exemplary computing environment in which the various embodiments described herein can be implemented.

Referring now to FIGS. 22 and 23, illustrated therein are exemplary computing networks 2200 and computing environments 2300 that can facilitate implementation of the systems and methods described above. For example, the audio device 302 and the MMI 304 described above can be connected through a computing network as illustrated in FIG. 22. The audio device 302 and/or the MMI 304 can utilize a computing environment of FIG. 23. Each of FIGS. 22 and 23 is not intended to be limiting, but, instead, to give an exemplary hardware context to the systems, devices, methods and algorithms described above.

Referring now to FIG. 22, illustrated is a non-limiting schematic diagram of an exemplary networked or distributed computing environment 2200. The distributed computing environment comprises computing objects 2210, 2212, etc. and computing objects or devices 2220, 2222, 2224, 2226, 2228, etc., which can include programs, methods, data stores, programmable logic, etc., as represented by applications 2230, 2232, 2234, 2236, 2238. It can be appreciated that objects 2220, 2212, etc. and computing objects or devices 2220, 2222, 2224, 2226, 2228, etc. can comprise different devices, such as audio devices, MMIs, remote controllers, PDAs, audio/video devices, mobile phones, MP3 players, laptops, etc.

Each object 2210, 2212, etc. and computing objects or devices 2220, 2222, 2224, 2226, 2228, etc. can communicate with one or more other objects 2210, 2212, etc. and computing objects or devices 2220, 2222, 2224, 2226, 2228, etc. by way of the communications network 2240, either directly or indirectly. Even though illustrated as a single element in FIG. 22, network 2240 can comprise other computing objects and computing devices that provide services to the system of FIG. 22, and/or can represent multiple interconnected networks, which are not shown. Each object 2210, 2212, etc. or 2220, 2222, 2224, 2226, 2228, etc. can also contain an application, such as applications 2230, 2232, 2234, 2236, 2238, that might make use of an API, or other object, software, firmware and/or hardware, suitable for communication with or implementation of the delayed interaction model as provided in accordance with various embodiments.

There are a variety of systems, components, and network configurations that support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to the techniques as described in various embodiments.

Thus, a host of network topologies and network infrastructures, such as client/server, peer-to-peer, or hybrid architectures, can be utilized. In a client/server architecture, particularly a networked system, a client is usually a computer that accesses shared network resources provided by another computer, e.g., a server. In the illustration of FIG. 22, as a non-limiting example, computers 2220, 2222, 2224, 2226, 2228, etc. can be thought of as clients and computers 2210, 2212, etc. can be thought of as servers where servers 2210, 2212, etc. provide data services, such as receiving data from client computers 2220, 2222, 2224, 2226, 2228, etc., storing of data, processing of data, transmitting data to client computers 2220, 2222, 2224, 2226, 2228, etc., although any computer can be considered a client, a server, or both, depending on the circumstances. Any of these computing devices can be processing data, or requesting services or tasks that can implicate the delayed interaction model and related techniques as described herein for one or more embodiments.

A server is typically a remote computer system accessible over a remote or local network, such as the Internet or wireless network infrastructures. The client process can be active in a first computer system, and the server process can be active in a second computer system, communicating with one another over a communications medium, thus providing distributed functionality and allowing multiple clients to take advantage of the information-gathering capabilities of the server. Any software objects utilized pursuant to the direction based services can be provided standalone, or distributed across multiple computing devices or objects.

In a network environment in which the communications network/bus 2240 is the Internet, for example, the servers 2210, 2212, etc. can be Web servers with which the clients 2220, 2222, 2224, 2226, 2228, etc. communicate via any of a number of known protocols, such as the hypertext transfer protocol (HTTP). Servers 2210, 2212, etc. can also serve as clients 2220, 2222, 2224, 2226, 2228, etc., as can be characteristic of a distributed computing environment.

As a further non-limiting example, various embodiments described herein apply to any handheld, portable and other computing devices and computing objects of all kinds are contemplated for use in connection with the various embodiments described herein, i.e., anywhere that a device can request pointing based services. Accordingly, the general purpose remote computer described below in FIG. 3 is but one example, and the embodiments of the subject disclosure can be implemented with any client having network/bus interoperability and interaction.

Although not required, any of the embodiments can partly be implemented via an operating system, for use by a developer of services for a device or object, and/or included within application software that operates in connection with the operable component(s). Software can be described in the general context of computer executable instructions, such as program modules, being executed by one or more computers, such as client workstations, servers or other devices. Those skilled in the art will appreciate that network interactions can be practiced with a variety of computer system configurations and protocols.

FIG. 23 illustrates an example of a suitable computing system environment 2300 in which one or more of the embodiments can be implemented, although as made clear above, the computing system environment 2300 is only one example of a suitable computing environment and is not intended to suggest any limitation as to the scope of use or functionality of any of the embodiments. Neither should the computing environment 2300 be interpreted as having any dependency or requirement relating to any one or combination of components illustrated in the exemplary operating environment 2300.

With reference to FIG. 23, an exemplary remote device for implementing one or more embodiments herein including an audio device 302 or a MMI 304 can include a general purpose computing device in the form of a handheld computer 2310. Components of handheld computer 2310 can include, but are not limited to, a processing unit 2320, a system memory 2330, and a system bus 2321 that couples various system components including the system memory to the processing unit 2320.

Computer 2310 typically includes a variety of computer readable media and can be any available media that can be accessed by computer 2310. The system memory 2330 can include computer storage media in the form of volatile and/or nonvolatile memory such as read only memory (ROM) and/or random access memory (RAM). By way of example, and not limitation, memory 2330 can also include an operating system, application programs, other program modules, and program data.

A user can enter commands and information into the computer 2310 through input devices 2340. A monitor or other type of display device is also connected to the system bus 2321 via an interface, such as output interface 2350. In addition to a monitor, computers can also include other peripheral output devices such as speakers and a printer, which can be connected through output interface 2350.

The computer 2310 can operate in a networked or distributed environment using logical connections to one or more other remote computers, such as remote computer 2370. The remote computer 2370 can be a personal computer, a server, a router, a network PC, a peer device or other common network node, or any other remote media consumption or transmission device, and can include any or all of the elements described above relative to the computer 2310. The logical connections depicted in FIG. 23 include a network 2371, such local area network (LAN) or a wide area network (WAN), but can also include other networks/buses. Such networking environments are commonplace in homes, offices, enterprise-wide computer networks, intranets and the Internet.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims.

What is claimed is:

1. A system, comprising:
    a memory that stores computer-executable components; and
    a processor, communicatively coupled to the memory, that executes or facilitates execution of the computer-executable components, the computer-executable components comprising:
        a tuning component configured to generate first tuning data based on a tuning process associated with a first user identity and performed by a user interface of a device, wherein the tuning component is configured to receive second tuning data from a data storage, and wherein the second tuning data is generated based on a defined dynamic range hearing level and a defined hearing threshold for a second user identity associated with a defined theoretical user; and
        a noise suppression component configured to adjust an audio signal based on a digital transformation that employs the first tuning data associated with the tuning process and the second tuning data associated with the data storage to adjust speech data associated with the audio signal and reduce noise data associated with the audio signal.

2. The system of claim 1, wherein the noise suppression component is configured to adjust the audio signal in response to a determination that the noise data is above a defined threshold.

3. The system of claim 2, wherein the noise suppression component is configured to adjust the audio signal based on a correction factor value, and wherein the tuning component is configured to generate the correction factor value based on the first tuning data and the second tuning data.

4. The system of claim 1, wherein the noise suppression component is configured to adjust the audio signal based on a set of filter bands associated with the digital transformation.

5. The system of claim 1, wherein the noise suppression component is configured to adjust the audio signal based on output data indicative of an output signal level of a speaker device that receives the audio signal.

6. The system of claim 1, wherein the computer-executable components further comprise:
a beam forming component configured to generate the audio signal.

7. The system of claim 1, wherein the audio signal comprises a first audio signal and a second audio signal, and wherein the computer-executable components further comprise:
a beam forming component configured to generate the first audio signal based on the speech data and the second audio signal based on the noise data.

8. The system of claim 7, wherein the noise suppression component is configured to adjust the first audio signal and the second audio signal.

9. A method, comprising:
generating, by a system comprising a processor, first tuning data associated with a first user identity and generated based on feedback data received via a user interface of a device;
receiving, by the system, second tuning data, indicative of a defined dynamic range hearing threshold and a defined hearing threshold, that is associated with a second user identity that corresponds to a defined theoretical user;
modifying, by the system, speech data associated with an audio signal based on the first tuning data and the second tuning data; and
reducing, by the system, noise data associated with the audio signal based on the first tuning data and the second tuning data.

10. The method of claim 9, further comprising:
monitoring, by the system, the noise data, wherein the reducing comprises reducing the noise data associated with the audio signal in response to determining that the noise data is above a threshold value.

11. The method of claim 10, wherein the receiving comprises receiving the second tuning data from a memory of the device.

12. The method of claim 9, wherein the modifying comprises modifying the speech data associated with the audio signal based on an output value associated with an output of an output device that receives the audio signal.

13. The method of claim 9, further comprising:
determining, by the system, a correction factor according to an output volume level of an output device that receives the audio signal.

14. The method of claim 13, further comprising:
determining, by the system, an output gain value based on the correction factor to compensate for the noise data.

15. The method of claim 14, wherein the modifying the audio signal comprises modifying the audio signal based on the output gain value.

16. The method of claim 9, wherein the modifying the audio signal comprises modifying the audio signal based on a digital transformation.

17. A non-transitory computer readable storage device comprising computer-executable instructions that, in response to execution, cause a device comprising a processor to perform operations, comprising:
receiving, via a user interface of the device, first tuning data generated based a tuning process associated with a first user identity;
receiving, from memory of the device, second tuning data, indicative of a fixed dynamic range hearing level and a fixed hearing threshold, that is associated with a second user identity for a defined theoretical user;
altering speech data associated with a signal based on the first tuning data and the second tuning data; and
minimizing noise data associated with the signal based on the first tuning data and the second tuning data.

18. The non-transitory computer readable storage device of claim 17, wherein the operations further comprise:
determining the noise data based on a beam forming technique.

19. The non-transitory computer readable storage device of claim 18, wherein the altering comprises altering the speech data associated with the signal based on a beam forming technique.

20. The non-transitory computer readable storage device of claim 17, wherein the altering comprises altering the signal based on output data generated by a speaker device that receives the signal.

* * * * *